(12) United States Patent
Fukushima et al.

(10) Patent No.: US 9,073,170 B2
(45) Date of Patent: Jul. 7, 2015

(54) POLISHING APPARATUS HAVING THERMAL ENERGY MEASURING MEANS

(71) Applicant: EBARA CORPORATION, Tokyo (JP)

(72) Inventors: Makoto Fukushima, Tokyo (JP); Katsuhide Watanabe, Tokyo (JP); Hozumi Yasuda, Tokyo (JP); Satoru Yamaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/563,358

(22) Filed: Dec. 8, 2014

(65) Prior Publication Data

US 2015/0093968 A1 Apr. 2, 2015

Related U.S. Application Data

(62) Division of application No. 13/226,800, filed on Sep. 7, 2011, now Pat. No. 8,932,106.

(30) Foreign Application Priority Data

Sep. 8, 2010 (JP) ................................. 2010-201098

(51) Int. Cl.
*B24B 49/00* (2012.01)
*B24B 51/00* (2006.01)
*B24B 37/30* (2012.01)
*B24B 37/015* (2012.01)
(Continued)

(52) U.S. Cl.
CPC ............... *B24B 37/015* (2013.01); *B24B 37/30* (2013.01); *H01L 21/67017* (2013.01); *H01L 21/6838* (2013.01); *B24B 37/10* (2013.01); *H01L 21/67092* (2013.01)

(58) Field of Classification Search
CPC ...... B24B 37/015; B24B 37/30; B24B 49/12; B24B 49/14; B24B 37/10
USPC .......... 451/5, 6, 7, 8, 285, 288, 290, 398, 402
See application file for complete search history.

(56) References Cited

U.S. PATENT DOCUMENTS

| 6,416,384 B1 | 7/2002 | Kawamoto et al. |
| 2003/0008600 A1 | 1/2003 | Ide |

(Continued)

FOREIGN PATENT DOCUMENTS

| JP | 08-267357 | 10/1996 |
| JP | 11-347936 | 12/1999 |

(Continued)

*Primary Examiner* — Timothy V Eley
(74) *Attorney, Agent, or Firm* — Wenderoth, Lind & Ponack, L.L.P.

(57) ABSTRACT

A polishing is used for polishing a substrate such as a semiconductor wafer to a flat mirror finish. The polishing apparatus includes a polishing table having a polishing surface, a substrate holding apparatus configured to hold the substrate and to press the substrate against the polishing surface, and a controller. The substrate holding apparatus includes an elastic membrane configured to form a substrate holding surface which is brought into contact with the substrate, a carrier provided above the elastic membrane, at least one pressure chamber formed between the elastic membrane and the carrier, and an infrared light detector configured to measure thermal energy from the elastic membrane. The controller calculates an estimate value of a temperature of the elastic membrane using a measured value of the infrared light detector.

11 Claims, 22 Drawing Sheets

(51) Int. Cl.
*H01L 21/67* (2006.01)
*H01L 21/683* (2006.01)
*B24B 37/10* (2012.01)

(56) References Cited

U.S. PATENT DOCUMENTS

| | | |
|---|---|---|
| 2003/0119429 A1 | 6/2003 | Bright et al. |
| 2005/0066739 A1 | 3/2005 | Gotkis et al. |
| 2005/0208880 A1 | 9/2005 | Saito et al. |
| 2006/0205323 A1 | 9/2006 | Togawa et al. |
| 2010/0279435 A1 | 11/2010 | Xu et al. |
| 2012/0040592 A1 | 2/2012 | Chen et al. |
| 2014/0015107 A1 | 1/2014 | Chen et al. |
| 2014/0020829 A1 | 1/2014 | Chen et al. |

FOREIGN PATENT DOCUMENTS

| | | |
|---|---|---|
| JP | 2000-225559 | 8/2000 |
| JP | 2001-105298 | 4/2001 |
| JP | 2001-353657 | 12/2001 |
| JP | 2002-301660 | 10/2002 |
| JP | 2004-249452 | 9/2004 |
| JP | 2005-514781 | 5/2005 |
| JP | 2005-268566 | 9/2005 |
| JP | 2006-128582 | 5/2006 |
| JP | 2006-332520 | 12/2006 |

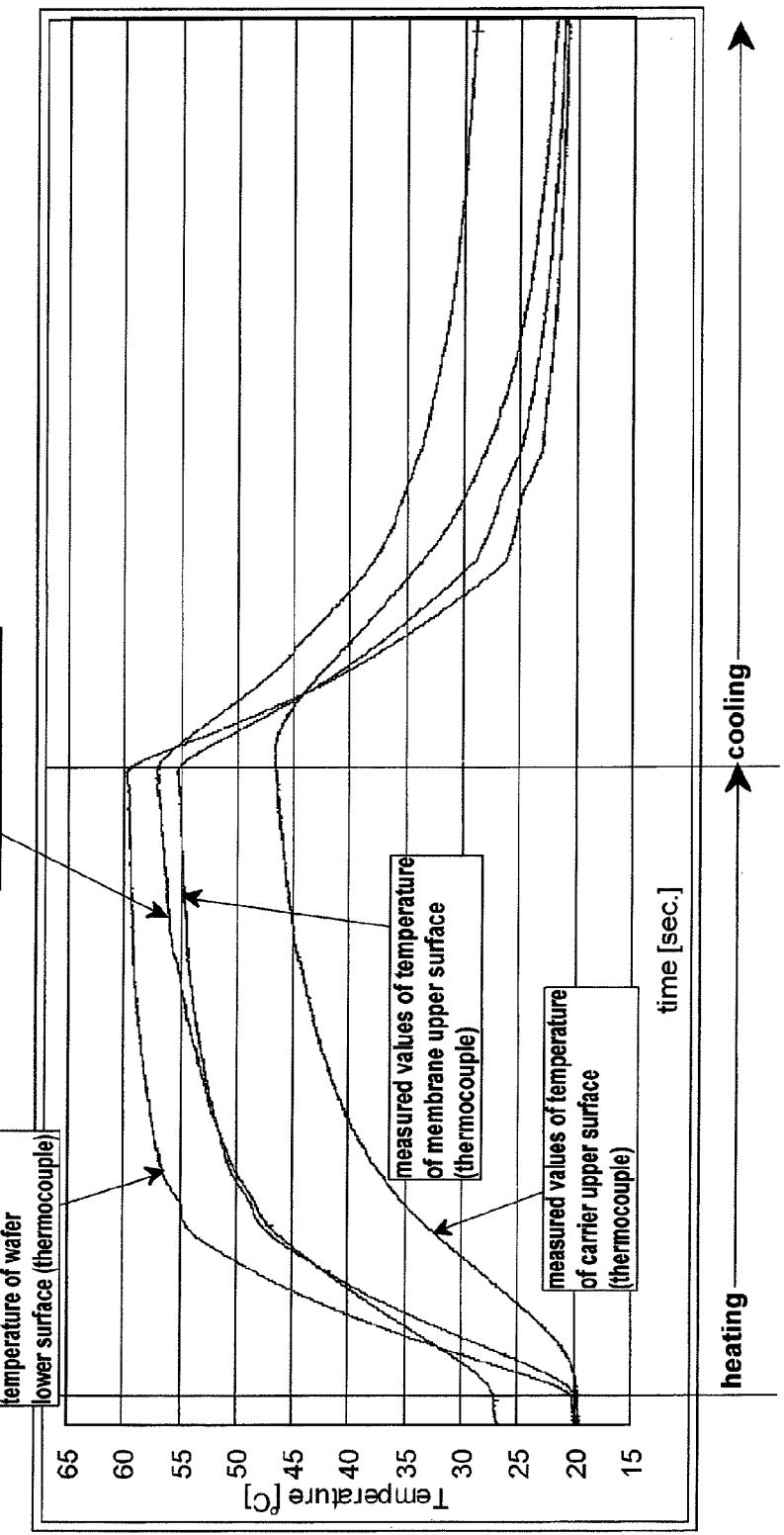

POLISHING APPARATUS HAVING THERMAL ENERGY MEASURING MEANS

BACKGROUND OF THE INVENTION

1. Field of the Invention

The present invention relates to a polishing apparatus and method, and more particularly to a polishing apparatus and method for polishing an object to be polished (substrate) such as a semiconductor wafer to a flat mirror finish.

2. Description of the Related Art

In recent years, high integration and high density in semiconductor device demands smaller and smaller wiring patterns or interconnections and also more and more interconnection layers. Multilayer interconnections in smaller circuits result in greater steps which reflect surface irregularities on lower interconnection layers. An increase in the number of interconnection layers makes film coating performance (step coverage) poor over stepped configurations of thin films. Therefore, better multi layer interconnections need to have the improved step coverage and proper surface planarization. Further, since the depth of focus of a photolithographic optical system is smaller with miniaturization of a photolithographic process, a surface of the semiconductor device needs to be planarized such that irregular steps on the surface of the semiconductor device will fall within the depth of focus.

Thus, in a manufacturing process of a semiconductor device, it increasingly becomes important to planarize a surface of the semiconductor device. One of the most important planarizing technologies is chemical mechanical polishing (CMP). Thus, there has been employed a chemical mechanical polishing apparatus for planarizing a surface of a semiconductor wafer. In the chemical mechanical polishing apparatus, while a polishing liquid containing abrasive particles such as silica ($SiO_2$) therein is supplied onto a polishing surface such as a polishing pad, a substrate such as a semiconductor wafer is brought into sliding contact with the polishing surface, so that the substrate is polished.

This type of polishing apparatus includes a polishing table having a polishing surface formed by a polishing pad, and a substrate holding device, which is referred to as a top ring or a polishing head, for holding a substrate such as a semiconductor wafer. When a semiconductor wafer is polished with such a polishing apparatus, the semiconductor wafer is held and pressed against the polishing surface under a predetermined pressure by the substrate holding device. At this time, the polishing table and the substrate holding device are moved relative to each other to bring the semiconductor wafer into sliding contact with the polishing surface, so that the surface of the semiconductor wafer is polished to a flat mirror finish.

In such polishing apparatus, if the relative pressing force applied between the semiconductor wafer, being polished, and the polishing surface of the polishing pad is not uniform over the entire surface of the semiconductor wafer, then the surface of the semiconductor wafer is polished insufficiently or excessively in different regions thereof, which depends on the pressing force applied thereto. It has been customary to uniformize the pressing force applied to the semiconductor wafer by providing a pressure chamber formed by an elastic membrane at the lower portion of the substrate holding device and supplying the pressure chamber with a fluid such as compressed air to press the semiconductor wafer against the polishing surface of the polishing pad under a fluid pressure through the elastic membrane.

On the other hand, a thin film formed on a surface of a semiconductor wafer as an object to be polished has different thicknesses depending on radial locations of the semiconductor wafer due to characteristics of a film-forming method or apparatus. Specifically, the thin film formed on the surface of the semiconductor wafer has an initial film thickness distribution in its radial direction. Therefore, as described above, in the substrate holding device for pressing the entire surface of the semiconductor wafer uniformly and polishing the semiconductor wafer, the semiconductor wafer is polished uniformly over the entire surface thereof, and thus the above initial film thickness distribution on the surface of the semiconductor wafer cannot be corrected. Therefore, as disclosed in Japanese laid-open patent publication No. 2006-128582, there has been proposed a polishing apparatus in which a plurality of pressure chambers are formed by an elastic membrane within a surface of the semiconductor wafer, and pressures of a pressurized fluid such as compressed air to be supplied to the respective pressure chambers are independently controlled to control pressures applied to the semiconductor wafer at the respective areas on the semiconductor wafer. Therefore, in such a polishing apparatus, a pressing force for pressing the semiconductor wafer against the polishing surface is made larger at the area having a thick film than that at the area having a thin film, and the polishing rate of the area having the thick film is selectively enhanced to polish the semiconductor wafer flatly over the entire surface of the semiconductor wafer without relying on the film thickness distribution at the time of film-forming.

When a substrate such as a semiconductor wafer is polished by the polishing apparatus having the above structure, the substrate is pressed against the polishing surface of the polishing pad under a certain polishing pressure and is brought into sliding contact with the polishing surface. As a result, a temperature of contact surface of the substrate with the polishing pad, i.e., a polishing temperature is raised. As described above, it is important to control the polishing pressure for the purpose of improving polishing performance. However, it is also very important to measure and control the polishing temperature for the purpose of improving the polishing performance. Specifically, because the polishing pad is composed of a resin material such as foamed polyurethane, the polishing temperature changes rigidity of the polishing pad to have an influence on planarization characteristic of the substrate. Further, since the chemical mechanical polishing (CMP) is a polishing method which utilizes a chemical reaction between a polishing liquid (polishing slurry) and a surface, being polished, of the substrate, the polishing temperature has an influence on chemical characteristic of the polishing slurry. Further, the distribution of the polishing rate changes depending on the polishing temperature to deteriorate the yield rate or to lower the polishing rate, thus deteriorating productivity of the polishing apparatus. Further, if there is temperature distribution within the surface of the substrate, the polishing performance within the surface of the substrate becomes nonuniform.

Therefore, as disclosed in Japanese laid-open patent publication Nos. 2002-301660 and 2005-268566, a temperature of a substrate such a semiconductor wafer is measured during polishing. Further, as disclosed in Japanese laid-open patent publication No. 2006-332520, a temperature of a membrane for holding a semiconductor wafer is measured as a means for measuring a temperature of a portion near a surface, being polished, of the semiconductor wafer during polishing.

SUMMARY OF THE INVENTION

As described above, in Japanese laid-open patent publication Nos. 2002-301660, 2005-268566 and 2006-332520, the temperature of the substrate such as a semiconductor wafer or the temperature of the membrane for holding the semiconductor wafer is measured during polishing. Further, Japanese laid-open patent publication No. 2002-301660 discloses that in order to measure a temperature of a substrate with high accuracy, the temperature of the surface of the substrate is measured by detecting infrared lights of two or more wavelengths from a reverse side of the substrate. However, in the technology disclosed in Japanese laid-open patent publication No. 2002-301660, as a method of pressing the substrate, a membrane for forming a pressure chamber cannot be used, and thus uniform distribution of the polishing rate cannot be obtained. Further, since the temperature of the surface, being polished, of the substrate is measured by measuring the infrared light which has passed through the substrate, transmission condition of the infrared light differs depending on the kind of film on the substrate, or a quantity of the infrared light changes if water droplets are attached to the reverse surface of the substrate or the reverse surface of the substrate is wet, resulting in different measurement results.

Further, in Japanese laid-open patent publication No. 2005-268566, an open-type airbag in which a substrate holding surface is open to measure the temperature of the substrate directly is used. However, in the open-type air bag, a pressurized fluid leaks during polishing, or water or a polishing liquid enters an open part of the air bag to hinder accurate measurement of the temperature. Further, as disclosed in Japanese laid-open patent publication No. 2005-268566, in the case where the temperature of the substrate is measured by an infrared radiation thermometer which is widely used, because the infrared light passes through a silicon wafer, the infrared radiation thermometer can measure only a temperature of a wafer having a metal film and is unsuitable for measuring temperatures of other objects. Further, even if a closed-type air bag is used and produced from a material for allowing electromagnetic radiations to pass therethrough, the temperature of the substrate cannot be measured with high accuracy because even the air bag composed of a thin film inhibits transmission of the electromagnetic radiations in some degree.

Further, Japanese laid-open patent publication No. 2006-332520 discloses a technology for measuring a temperature of a membrane for holding a semiconductor wafer as a means for measuring a temperature near a surface, being polished, of the semiconductor wafer. However, in the technology disclosed in Japanese laid-open patent publication No. 2006-332520, because the temperature sensor is attached to the membrane, when the membrane as expendables is replaced, it is necessary to replace the temperature sensor simultaneously. Therefore, this technology necessitates a very expensive structure, and a work for wiring of the temperature sensor or the like each time the membrane is replaced, thus deteriorating productivity.

The inventors of the present invention have intensively studied the conventional technology disclosed in Japanese laid-open patent publication Nos. 2006-128582, 2002-301660, 2005-268566, 2006-332520 and the like. As a result, it has been discovered that although it is desirable to measure a temperature of a substrate such as a semiconductor wafer during polishing, if a membrane for forming a pressure chamber cannot be employed, a serious problem that a polishing performance of the polishing apparatus cannot be maintained arises. Therefore, estimation of the temperature of the substrate during polishing by measuring a temperature of a membrane, for example, a membrane near the substrate based on the premise of employing the membrane for forming the pressure chamber has been discovered to be the best.

Therefore, the inventors of the present invention have attempted estimation of a temperature of the substrate during polishing from a temperature of the membrane for forming the pressure chamber by measuring the temperature of the membrane with a noncontact-type infrared radiation thermometer. Then, several types of membranes are mounted on the substrate holding apparatus (top ring), and experiments for measuring temperatures of the membranes by an infrared radiation thermometer and a thermocouple have been conducted repeatedly while the substrates held by the membranes are heated and cooled, thereby examining the relationship of both measurements. As a result, it has been discovered that the measurement value of the temperature of the membrane by the infrared radiation thermometer and the measurement value of the membrane by the thermocouple coincide generally with each other in a certain type of membrane, but differ from each other in other types of membranes (described later).

The inventors of the present invention have analyzed a cause of the above difference and have found that because the upper surface of the membrane reflects the infrared light, measurement values are affected by temperatures of parts located around the membrane, and thus the temperature of the membrane cannot be measured by the infrared radiation thermometer with high accuracy. The membrane is produced by a mold in a forming process. Since the surface of the mold is normally processed by mirror finish, the surface of the membrane also becomes in a mirror surface state having small surface roughness. The upper surface of the membrane which is in a mirror surface state has high reflectance of the infrared light. Thus, in the case where measurement of the infrared radiation temperature is performed from the location above the membrane, measurement value is strongly influenced by the infrared light radiated from the parts located around the membrane, and thus the temperature of the membrane cannot be measured with high accuracy.

Further, the inventors of the present invention have discovered that in the case where the temperature of the membrane is measured by a noncontact-type infrared radiation thermometer, the temperature of the membrane cannot be measured with high accuracy due to dew condensation in the membrane.

The inventors of the present invention have conducted various experiments and analyzed the experimental results for finding out a cause of the dew condensation in the membrane, and have obtained the following knowledge.

When the substrate is pressed against the polishing pad and is polished, the membrane and a gas in the pressure chamber are heated by processing heat to cause temperature rise. After polishing the substrate, the substrate is removed from the substrate holding surface, and then the substrate holding surface is cleaned by a cleaning liquid in a cleaning process to cool the membrane and the gas in the pressure chamber. Thus, the membrane and the gas in the pressure chamber repeat temperature rise and temperature drop. On the other hand, fluid passages for supplying a gas into the pressure chamber are normally connected to a pressure controller, a pressure release valve, a vacuum source and the like. As a pressurized fluid, an inert gas such as $N_2$ or dry air from which water content is removed is normally used, and hence dew condensation does not occur. However, when the substrate is held under vacuum by the substrate holding apparatus, the pressure chamber becomes in a vacuum state to hold the substrate under vacuum. Thereafter, when polishing of the substrate is started or the substrate is removed from the substrate holding apparatus, the vacuum state is released by exposure to an atmospheric pressure of the pressure chamber. When the fluid passage communicating with the pressure chamber is switched from the vacuum state to the state of the pressure release to an atmospheric pressure, air in the atmosphere in which the polishing apparatus is placed enters the fluid passage. Thus, air containing water content enters the pressure chamber by this pressure release operation, and the gas in the pressure chamber repeats temperature rise and temperature drop, resulting in dew condensation in the membrane. When water droplets are attached to the upper surface of the membrane due to dew condensation in the membrane, a quantity of the infrared light radiated from such part having water droplets changes compared to the case where there is no water droplets, and thus the temperature of the membrane cannot be measured with high accuracy by the infrared radiation thermometer. Further, as an amount of water droplets caused by dew condensation increases, water is accumulated in the pressure chamber to change the pressure applied to the substrate, and thus stable polishing cannot be carried out.

The present invention has been made in view of the above circumstances. It is therefore an object of the present invention to provide a substrate holding apparatus having a membrane for forming a pressure chamber which can control a temperature of a substrate such as a semiconductor wafer by estimating the temperature of the substrate during polishing.

Further, another aspect of the present invention is to provide a polishing apparatus having such substrate holding apparatus.

In order to achieve the above objects, according to a first aspect of the present invention, there is provided a polishing apparatus for polishing a substrate, comprising: a polishing table having a polishing surface; a substrate holding apparatus configured to hold the substrate and to press the substrate against the polishing surface; and a controller; the substrate holding apparatus comprising: an elastic membrane configured to form a substrate holding surface which is brought into contact with the substrate; a carrier provided above the elastic membrane; at least one pressure chamber formed between the elastic membrane and the carrier; and an infrared light detector configured to measure thermal energy from the elastic membrane; wherein the controller calculates an estimate value of a temperature of the elastic membrane using a measured value of the infrared light detector.

According to the present invention, while a substrate such as a semiconductor wafer is held by an elastic membrane and pressed against a polishing surface to polish the substrate, thermal energy radiated from the elastic membrane is measured by an infrared light detector, and an estimate value of a temperature of the elastic membrane is calculated using a measured value of the infrared light detector by a controller. In this case, a correlation between the measured value of the infrared light detector and the temperature of the elastic membrane has been obtained in advance by experiment, and the estimate value of the temperature of the elastic membrane is calculated using the correlation. Because the elastic membrane constitutes a substrate holding surface for holding the substrate, the elastic membrane is a member which is most affected by the temperature of the substrate, and thus the temperature of the substrate can be estimated indirectly by estimating the temperature of the elastic membrane.

In a preferred aspect of the present invention, the controller calculates an estimate value of a temperature of the substrate using the estimate value of the temperature of the elastic membrane.

According to the present invention, an estimate value of a temperature of the substrate is calculated from the estimate value of the temperature of the elastic membrane by the controller. In this case, a correlation between a temperature of the elastic membrane and a temperature of the substrate has been obtained in advance by experiment, and the estimate value of the temperature of the substrate is calculated using the correlation.

In a preferred aspect of the present invention, a polishing condition is changed using the estimate value of the temperature of the elastic membrane.

According to the present invention, in the case where the estimate value of the temperature of the elastic membrane or the estimate value of the temperature of the substrate is high during polishing, a polishing pressure is lowered by lowering a pressure of a pressure chamber to suppress temperature rise of the substrate or the elastic membrane. Further, the temperature control of the entire surface of the polishing surface may be performed or the temperature control of a portion of the polishing surface corresponding to the measured pressure chamber may be performed using a device for cooling and heating the polishing surface provided outside the substrate holding apparatus. As a device for adjusting a temperature of the polishing surface, there are a device for adjusting the temperature of the polishing surface by bringing a medium into contact with the polishing surface, a device for blowing a fluid onto the polishing surface, and the like.

In a preferred aspect of the present invention, the infrared light detector comprises an infrared radiation thermometer.

According to the present invention, the temperature of the elastic membrane can be measured by measuring a quantity of the infrared light as thermal energy radiated from the elastic membrane as an object to be measured.

In order to achieve the above objects, according to a second aspect of the present invention, there is provided a substrate holding apparatus for holding a substrate and pressing the substrate against a polishing surface, comprising: an elastic membrane configured to form a substrate holding surface which is brought into contact with the substrate; a carrier provided above the elastic membrane; at least one pressure chamber formed between the elastic membrane and the carrier; and an infrared light detector configured to measure thermal energy from the elastic membrane; wherein surface roughing processing is applied to a rear surface side of the substrate holding surface of the elastic membrane.

According to the present invention, while a substrate such as a semiconductor wafer is held by an elastic membrane and pressed against a polishing surface to polish the substrate, thermal energy radiated from the elastic membrane is measured by an infrared light detector. Because surface roughing processing is applied to a rear surface side of the substrate holding surface of the elastic membrane, the reflectance of the infrared light at the rear surface side of the substrate holding surface of the elastic membrane is lowered, and thus the infrared light detector can measure thermal energy radiated from the elastic membrane with high accuracy. Therefore, the temperature of the elastic membrane can be measured with high accuracy.

In order to achieve the above objects, according to a third aspect of the present invention, there is provided a substrate holding apparatus for holding a substrate and pressing the substrate against a polishing surface, comprising: an elastic membrane configured to form a substrate holding surface which is brought into contact with the substrate; a carrier provided above the elastic membrane; at least one pressure chamber formed between the elastic membrane and the carrier; an infrared light detector configured to measure thermal energy from the elastic membrane; and a measuring instrument disposed at a rear surface side of the substrate holding surface of the elastic membrane and configured to measure thermal energy of a portion other than the elastic membrane.

According to the present invention, while a substrate such as a semiconductor wafer is held by an elastic membrane and pressed against a polishing surface to polish the substrate, thermal energy radiated from the elastic membrane is measured by an infrared light detector, and thermal energy of a portion, other than the elastic membrane, located at a rear surface side of the elastic membrane is measured by a measuring instrument. Then, the estimate value of the temperature of the elastic membrane or the estimate value of the temperature of the substrate is calculated using the measured value of the thermal energy of the elastic membrane by the infrared light detector and the measured value of the thermal energy of the portion, other than the elastic membrane, by the measuring instrument. In the case where the infrared light radiated from the portion, other than the elastic membrane, located at the rear surface side of the elastic membrane is reflected from the elastic membrane to exert a great influence on the infrared light detector, the temperature of the elastic membrane or the temperature of the substrate cannot be estimated by the measured value of the infrared light detector with high accuracy. Therefore, the estimate value of the temperature of the elastic membrane or the estimate value of the temperature of the substrate is calculated using the measured value of the infrared light detector and the measured value at the portion, other than the elastic membrane, by the measuring instrument.

In a preferred aspect of the present invention, the measuring instrument measures the thermal energy of the carrier.

According to the present invention, by measuring the thermal energy of the carrier which forms the pressure chamber together with the elastic membrane, the temperature of the carrier can be measured. In the case where the infrared light radiated from the carrier is reflected from the elastic membrane to exert a great influence on the infrared light detector, the temperature of the elastic membrane or the temperature of the substrate cannot be estimated by the measured value of the infrared light detector with high accuracy. Therefore, the estimate value of the temperature of the elastic membrane or the estimate value of the temperature of the substrate is calculated using the measured value of the infrared light detector and the measured value of the temperature of the carrier by the measuring instrument.

In a preferred aspect of the present invention, a substrate holding apparatus further comprises a pressure sensor configured to measure a pressure of the pressure chamber.

According to the present invention, the pressure in the pressure chamber can be controlled to a desired value by measuring the pressure of the pressure chamber by a pressure sensor. For example, a first pressure controller and a second pressure controller are coupled to one pressure chamber, and the two pressure controllers are set to the same control pressure at the start of polishing. When the estimate value of the temperature of the substrate exceeds the predetermined temperature during the polishing process, the set pressure of the second pressure controller is lowered, while the set pressure of the first pressure controller is maintained at the same pressure. Thus, the pressurized fluid flows from a fluid passage communicating with the first pressure controller toward a fluid passage communicating with the second pressure controller, and this flow of the pressurized fluid cools the interior of the pressure chamber. At this time, the pressure in the pressure chamber is monitored by the pressure sensor, and when the pressure in the pressure chamber drops greatly below the control pressure, the set pressure of the second pressure controller is increased so that a desired pressure is developed in the pressure chamber.

In a preferred aspect of the present invention, a substrate holding apparatus further comprises a controller configured to calculate an estimate value of a temperature of the elastic membrane using a measured value of the infrared light detector and a measured value of the measuring instrument.

According to the present invention, the estimate value of the temperature of the elastic membrane is calculated using the measured value of the thermal energy of the elastic membrane by the infrared light detector and the measured value of the thermal energy of the portion, other than the elastic membrane, by the measuring instrument.

In a preferred aspect of the present invention, plural sets of a measured value of a temperature of the elastic membrane, a measured value ($T_1$) of the infrared light detector, and a measured value ($T_2$) of the measuring instrument are prepared in advance, regression coefficients $b_0$, $b_1$ and $b_2$ which minimize (the measured value of the temperature of the elastic membrane–the estimate value of the temperature of the elastic membrane)$^2$ in a multiple linear regression equation represented by (the estimate value of the temperature of the elastic membrane)=$b_0+b_1 \times T_1+b_2 \times T_2$ are calculated; and the estimate value of the temperature of the elastic membrane is calculated by the following equation: (the estimate value of the temperature of the elastic membrane)=$b_0+b_1 \times$(the measured value of the temperature of the elastic membrane)+$b_2 \times$(the measured value of the measuring instrument).

In a preferred aspect of the present invention, the controller calculates an estimate value of a temperature of the substrate using the estimate value of the temperature of the elastic membrane and the measured value of the measuring instrument.

According to the present invention, the estimate value of the temperature of the substrate is calculated using the measured value of the thermal energy of the elastic membrane by the infrared light detector and the measured value of the thermal energy of the portion, other than the elastic membrane, by the measuring instrument.

In a preferred aspect of the present invention, plural sets of a measured value of a temperature of the substrate, the estimate value ($T_1$) of the temperature of the elastic membrane and the measured value ($T_2$) of the measuring instrument are prepared in advance, regression coefficients $b_0, b_1$ and $b_2$ which minimize (the measured value of the temperature of the substrate–the estimate value of the temperature of the substrate)$^2$ in a multiple linear regression equation represented by (the estimate value of the temperature of the substrate)= $b_0+b_1 \times T_1+b_2 \times T_2$ are calculated, and the estimate value of the temperature of the substrate is calculated by the following equation: (the estimate value of the temperature of the substrate)=$b_0+b_1 \times$(the estimate value of the temperature of the elastic membrane)+$b_2 \times$(the measured value of the measuring instrument).

In a preferred aspect of the present invention, at least two pressure chambers are formed between the elastic membrane and the carrier, and the infrared light detector is provided in at least one pressure chamber of at least two pressure chambers.

According to the present invention, in the substrate holding apparatus having a plurality of pressure chambers, an infrared light detector is provided in one pressure chamber, and from the measurement result of this infrared light detector, the pressure of each pressure chamber may be changed or the polishing conditions such as operation of the temperature adjusting device of the polishing surface may be changed. Further, two infrared light detectors are provided in two pressure chambers, respectively, and from the measurement results of the two infrared light detectors, the temperature of the elastic membrane or the temperature of the substrate may be estimated by linear interpolation. Further, the infrared light detectors are provided so as to correspond to all of the pressure chambers, and from the measurement results of the respective infrared light detectors, the temperature of the elastic membrane or the temperature of the substrate at positions corresponding to the respective pressure chambers may be estimated.

In a preferred aspect of the present invention, the substrate holding surface of the elastic membrane for forming the pressure chamber in which the infrared light detector is provided has no opening.

According to the present invention, because the substrate holding surface of the elastic membrane for forming the pressure chamber in which the infrared light detector is provided has no opening, when the substrate holding surface is cleaned, the cleaning liquid can be prevented from entering the pressure chamber in which the infrared light detector is provided. Therefore, water droplets can be prevented from remaining at the rear surface side of the elastic membrane, and thus the accuracy of the infrared light detector can be ensured.

In a preferred aspect of the present invention, the infrared light detector comprises an infrared radiation thermometer.

According to the present invention, the temperature of the elastic membrane can be measured by measuring a quantity of the infrared light as thermal energy radiated from the elastic membrane as an object to be measured.

In order to achieve the above objects, according to a fourth aspect of the present invention, there is provided a polishing apparatus comprising: a polishing table having a polishing surface; and a substrate holding apparatus according to any one of claims 5 to 15.

In order to achieve the above objects, according to a fifth aspect of the present invention, there is provided a polishing apparatus for polishing a substrate, comprising: a polishing table having a polishing surface; a substrate holding apparatus configured to hold the substrate and to press the substrate against the polishing surface; the substrate holding apparatus comprising: an elastic membrane configured to form a substrate holding surface which is brought into contact with the substrate; a carrier provided above the elastic membrane; at least one pressure chamber formed between the elastic membrane and the carrier; and a first passage communicating with the pressure chamber; wherein the first passage is connected only to a gas source isolated from an atmosphere in which the polishing apparatus is placed.

According to the present invention, when the pressure of the pressure chamber increases from the vacuum state to an atmospheric pressure, a gas can be supplied to the pressure chamber from a gas source isolated from the atmosphere in which the polishing apparatus is placed. Therefore, air containing water content can be prevented from entering the pressure chamber, and thus dew condensation on the elastic membrane in the pressure chamber does not occur.

In order to achieve the above objects, according to a sixth aspect of the present invention, there is provided a polishing apparatus for polishing a substrate, comprising: a polishing table having a polishing surface; a substrate holding apparatus configured to hold the substrate and to press the substrate against the polishing surface; the substrate holding apparatus comprising: an elastic membrane configured to form a substrate holding surface which is brought into contact with the substrate; a carrier provided above the elastic membrane; at least one pressure chamber formed between the elastic membrane and the carrier; and a first passage communicating with the pressure chamber; wherein only a gas whose dew-point temperature is not more than 20° C. under an atmospheric pressure is supplied to the pressure chamber.

According to the present invention, even if the elastic membrane is cooled by deionized water (pure water) used for cleaning the top ring or the like, when the pressure of the pressure chamber increases from the vacuum state to an atmospheric pressure, only a gas whose dew-point temperature under atmospheric pressure is not more than 20° C. is supplied to the pressure chamber. Therefore, dew condensation on the elastic membrane in the pressure chamber does not occur.

According to the present invention, the temperature of a substrate such as a semiconductor wafer can be controlled by estimating the temperature of the substrate. More specifically, the present invention has the following effects:

(1) When the temperature of the substrate increases during polishing, the rigidity of the polishing pad is lowered to deteriorate planarization characteristics of polishing. This is because concave portions of unevenness of the pattern surface on the substrate are also polished due to a lowering of the rigidity of the polishing pad, and thus removal of the step height finally cannot be sufficiently performed. According to the present invention, the temperature of the substrate can be estimated with high accuracy, and if the substrate temperature becomes a predetermined value or higher, the polishing conditions or the like are changed, thereby suppressing temperature rise of the substrate.

(2) Because the polishing slurry causes chemical change on the surface of the substrate, reaction temperature is very important parameter. According to the present invention, because the temperature of the substrate can be estimated with high accuracy, the substrate can be polished at a temperature range which fits characteristics of the polishing slurry in various processes. For example, in the process in which the polishing rate is lowered at a polishing temperature of a predetermined value or higher, the substrate temperature is estimated with high accuracy, and the polishing conditions are changed so as not to increase the substrate temperature to the predetermined value or higher. In contrast, in the case where the polishing rate is lowered at a polishing temperature of a predetermined value or lower, the polishing conditions are changed so as not to decrease the substrate temperature to the predetermined value or lower. Further, in the process in which defects on the substrate (such as foreign matter on the substrate or scratches on the substrate), step height removal performance, polishing stability, and the like have dependency on the polishing temperature other than the polishing rate, the polishing temperature can be controlled in consideration of the effect on the defects on the substrate, the step height removal performance, the polishing stability, and the like.

(3) According to the present invention, because the temperature of the substrate can be estimated with high accuracy, the distribution of the temperature within the surface of the substrate can be grasped with high accuracy. Then, by controlling the distribution of the temperature within the surface of the substrate so as to be uniformized, the polishing characteristics within the surface of the substrate can be controlled uniformly, or the temperature of the surface of the substrate can be controlled so as to have any distribution of the temperature. For example, in the case where the distribution of the film thickness on the substrate is not uniform before polishing, in order to uniformize the distribution of the film thickness on the substrate after polishing, controlling the temperature of the substrate so as to have distribution of the temperature within the surface of the substrate can be utilized for intentionally creating the distribution of the temperature within the surface of the substrate during polishing.

Further, according to the present invention, because estimate of the temperature of the membrane (elastic membrane) as well as estimate of the temperature of the substrate can be made, the following effects can be obtained.

(1) By estimating the temperature of the membrane, the above effect of estimate of the temperature of the substrate can be obtained indirectly.

(2) The membrane is thermally expanded by its temperature. Because the retainer ring is located at the outer circumferential side of the membrane, if the thermal expansion of the membrane becomes large, the expanded outer circumferential side of the membrane is brought into contact with the inner circumferential side of the retainer ring, and thus the outer circumferential side of the membrane is restrained. Then, wrinkles are formed in the membrane or the membrane is deformed, thus hindering pressurization to the substrate by the membrane. According to the present invention, because the temperature of the membrane can be grasped, an amount of thermal expansion of the membrane can be grasped, and the temperature of the membrane can be controlled so as not to bring the membrane into contact with the retainer ring.

(3) When the temperature of the membrane increases, the hardness of the membrane is lowered (the membrane becomes soft), and thus especially the pressure applied to the substrate at an outer circumferential portion of the substrate is changed. Normally, the substrate is pressed by inflating the outer circumferential portion of the membrane. When the hardness of the membrane is lowered, the tension of rubber required for inflating the membrane is lowered to reduce the loss of the pressure of the air bag (pressure applied to the membrane) due to the tension of the rubber. As a result, higher pressure than expected is applied to the substrate. According to the present invention, because the temperature of the membrane can be grasped and controlled, the hardness of the membrane can be maintained within a certain range, and thus the pressing force applied to the substrate can be maintained at a desired constant value. Further, the pressure of the air bag can be controlled to make the pressing force applied to the substrate constant based on the temperature of the membrane. Specifically, when the temperature of the membrane increases, the membrane becomes soft to reduce the pressure of the air bag.

Further, according to the present invention, when the pressure of the pressure chamber increases from the vacuum state to an atmospheric pressure, the gas can be supplied to the pressure chamber from the gas source isolated from the atmosphere in which the polishing apparatus is placed. Therefore, air containing water content can be prevented from entering the pressure chamber. Thus, dew condensation on the elastic membrane in the pressure chamber does not occur.

BRIEF DESCRIPTION OF THE DRAWINGS

FIG. 5 is a graph in which time variations of the temperatures are plotted when the lower surface of the semiconductor wafer (substrate) is heated by forced heating, and then cooled by forced cooling using the experimental apparatus shown in FIG. 4;

DETAILED DESCRIPTION OF THE PREFERRED EMBODIMENTS

Figure 1:
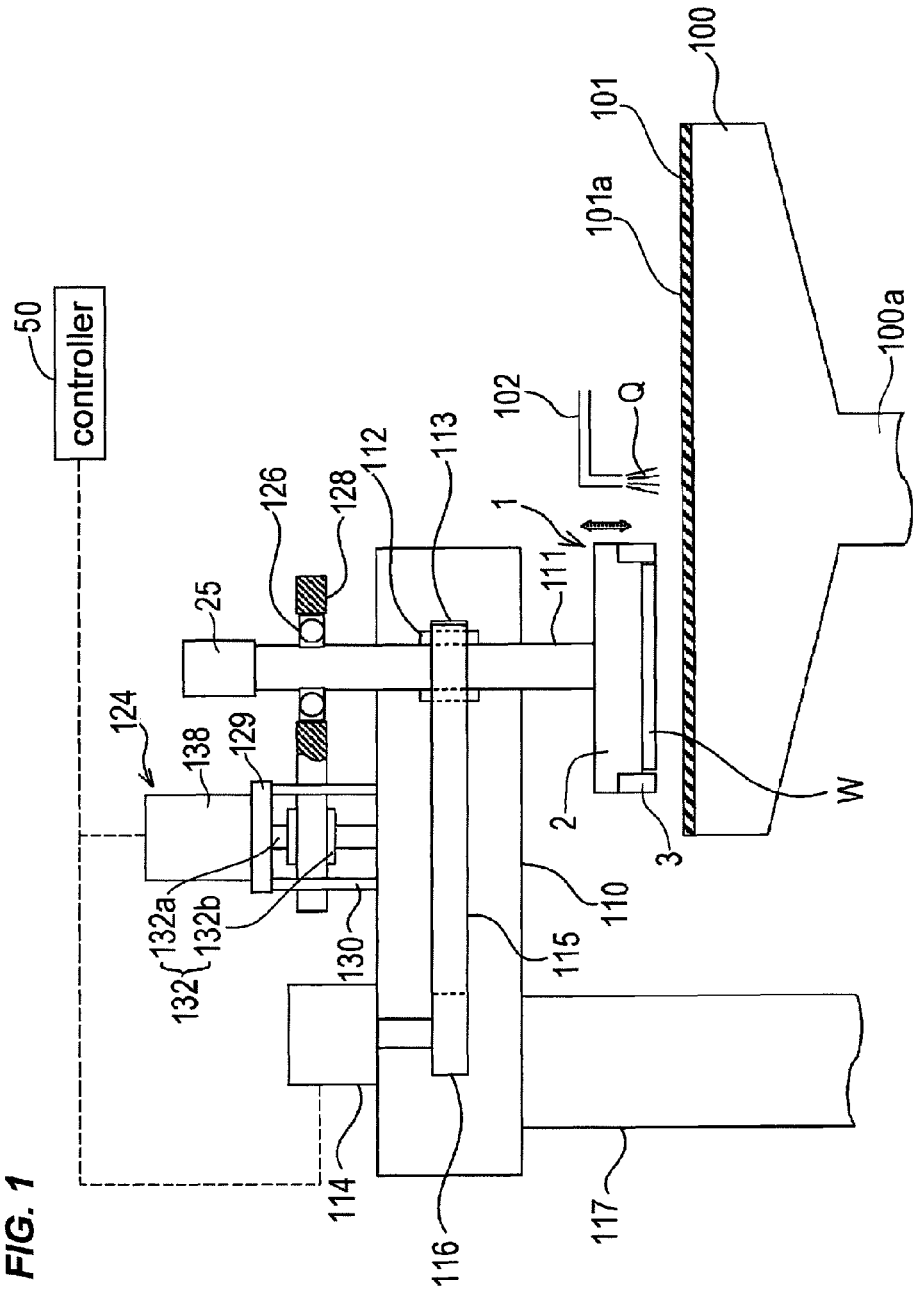
FIG. 1 is a schematic view showing an entire structure of a polishing apparatus according to an embodiment of the present invention.

A polishing apparatus according to embodiments of the present invention will be described below with reference to FIGS. 1 through 22. Like or corresponding parts are denoted by like or corresponding reference numerals throughout drawings and will not be described below repetitively.

FIG. 1 is a schematic view showing an entire structure of a polishing apparatus according to an embodiment of the present invention. As shown in FIG. 1, the polishing apparatus comprises a polishing table 100, and a top ring 1 for holding a substrate such as a semiconductor wafer as an object to be polished and pressing the substrate against a polishing surface on the polishing table 100.

The polishing table 100 is coupled via a table shaft 100a to a motor (not shown) disposed below the polishing table 100. Thus, the polishing table 100 is rotatable about the table shaft 100a. A polishing pad 101 is attached to an upper surface of the polishing table 100. An upper surface 101a of the polishing pad 101 constitutes a polishing surface to polish a semiconductor wafer W. A polishing liquid supply nozzle 102 is provided above the polishing table 100 to supply a polishing liquid (polishing slurry) Q onto the polishing pad 101 on the polishing table 100.

Various kinds of polishing pads are available on the market. For example, some of these are SUBA800, IC-1000, and IC-1000/SUBA400 (two-layer cloth) manufactured by Nitta-Haas Inc., and Surfin xxx-5 and Surfin 000 manufactured by Fujimi Inc. SUBA800, Surfin xxx-5, and Surfin 000 are non-woven fabrics bonded by urethane resin, and IC-1000 is made of rigid foamed polyurethane (single layer). Foamed polyurethane is porous and has a large number of fine recesses or holes formed in its surface.

The top ring 1 basically comprises a top ring body 2 for pressing a semiconductor wafer W against the polishing surface 101a, and a retainer ring 3 for holding an outer peripheral edge of the semiconductor wafer W to prevent the semiconductor wafer W from being slipped out of the top ring.

The top ring 1 is connected to a top ring shaft 111, and the top ring shaft 111 is vertically movable with respect to a top ring head 110 by a vertically movable mechanism 124. When the top ring shaft 111 moves vertically, the top ring 1 is lifted and lowered as a whole for positioning with respect to the top ring head 110. A rotary joint 25 is mounted on the upper end of the top ring shaft 111. The vertical movement mechanism 124, which vertically moves the top ring shaft 111 and the top ring 1, has a bridge 128 supporting the top ring shaft 111 in a manner such that the top ring shaft 111 is rotatable via a bearing 126, a ball screw 132 mounted on the bridge 128, a support stage 129 which is supported by poles 130, and an AC servomotor 138 provided on the support stage 129. The support stage 129, which supports the servomotor 138, is fixed to the top ring head 110 via the poles 130.

The ball screw 132 has a screw shaft 132a which is coupled to the servomotor 138, and a nut 132b into which the screw shaft 132a is threaded. The top ring shaft 111 is configured to be vertically movable together with the bridge 128. Accordingly, when the servomotor 138 is driven, the bridge 128 is vertically moved through the ball screw 132. As a result, the top ring shaft 111 and the top ring 1 are vertically moved.

Further, the top ring shaft 111 is connected to a rotary sleeve 112 by a key (not shown). The rotary sleeve 112 has a timing pulley 113 fixedly disposed therearound. A top ring motor 114 is fixed to the top ring head 110. The timing pulley 113 is operatively coupled to a timing pulley 116 provided on the top ring motor 114 by a timing belt 115. Therefore, when the top ring motor 114 is driven, the timing pulley 116, the timing belt 115 and the timing pulley 113 are rotated to rotate the rotary sleeve 112 and the top ring shaft 111 in unison with each other, thus rotating the top ring 1. The top ring head 110 is supported on a top ring head shaft 117 which is rotatably supported by a flame (not shown). The polishing apparatus has a controller 50 for controlling respective apparatuses including the top ring motor 114, the servomotor 138, the polishing table motor and the like.

In the polishing apparatus constructed as shown in FIG. 1, the top ring 1 is configured to hold a substrate such as a semiconductor wafer W on its lower surface. The top ring head 110 is pivotable about the top ring shaft 117. Thus, the top ring 1, which holds the semiconductor wafer W on its lower surface, is moved from a position at which the top ring 1 receives the semiconductor wafer W to a position above the polishing table 100 by pivitable movement of the top ring head 110. Then, the top ring 1 is lowered to press the semiconductor wafer W against the surface (polishing surface) 101a of the polishing pad 101. At this time, while the top ring 1 and the polishing table 100 are respectively rotated, a polishing liquid is supplied onto the polishing pad 101 from the polishing liquid supply nozzle 102 provided above the polishing table 100. In this manner, the semiconductor wafer W is brought into sliding contact with the polishing surface 101a of the polishing pad 101. Thus, a surface of the semiconductor wafer W is polished.

Figure 2:
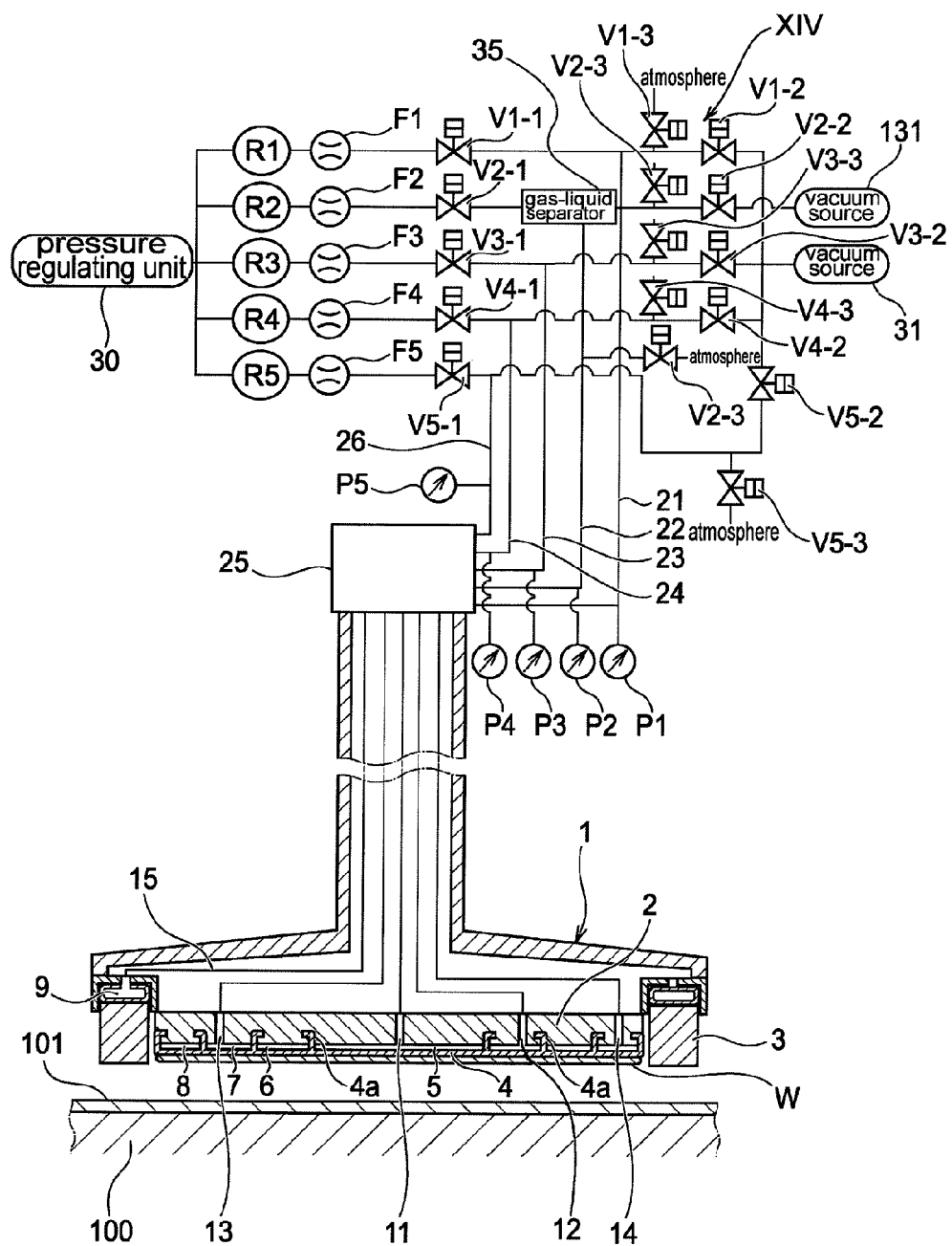
FIG. 2 is a schematic cross-sectional view showing a top ring constituting a substrate holding apparatus for holding a semiconductor wafer as an object to be polished and pressing the semiconductor wafer against a polishing surface on a polishing table.

Next, the top ring (polishing head) of the polishing apparatus according to the present invention will be described below with reference to FIG. 2. FIG. 2 is a schematic cross-sectional view showing the top ring 1 constituting a substrate holding apparatus for holding a semiconductor wafer W as an object to be polished and pressing the semiconductor wafer W against a polishing surface on a polishing table. FIG. 2 shows only main structural elements constituting the top ring 1.

As shown in FIG. 2, the top ring 1 basically comprises a top ring body (described also as carrier) 2 for pressing a semiconductor wafer W against the polishing surface 101a, and a retainer ring 3 for directly pressing the polishing surface 101a. The top ring body (carrier) 2 is in the form of a circular plate, and the retainer ring 3 is attached to a peripheral portion of the top ring body 2. The top ring body 2 is made of resin such as engineering plastics (e.g., PEEK). As shown in FIG. 2, the top ring 1 has an elastic membrane 4 attached to a lower surface of the top ring body 2. The elastic membrane 4 is brought into contact with a rear face of a semiconductor wafer held by the top ring 1. The elastic membrane 4 is made of a highly strong and durable rubber material such as ethylene propylene rubber (EPDM), polyurethane rubber, silicone rubber, or the like. The elastic membrane 4 constitutes a substrate holding surface for holding the substrate such as a semiconductor wafer.

The elastic membrane 4 has a plurality of concentric partition walls 4a, and a circular central chamber 5, an annular ripple chamber 6, an annular outer chamber 7 and an annular edge chamber 8 are defined by the partition walls 4a between the upper surface of the elastic membrane 4 and the lower surface of the top ring body 2. Specifically, the central chamber 5 is defined at the central portion of the top ring body 2, and the ripple chamber 6, the outer chamber 7 and the edge chamber 8 are concentrically defined in the order from the central portion to the peripheral portion of the top ring body 2. A passage 11 communicating with the central chamber 5, a passage 12 communicating with the ripple chamber 6, a passage 13 communicating with the outer chamber 7 and a passage 14 communicating with the edge chamber 8 are formed in the top ring body 2. The passage 11 communicating with the central chamber 5, the passage 13 communicating with the outer chamber 7, and the passage 14 communicating with the edge chamber 8 are connected to a passage 21, a passage 23 and a passage 24, respectively via a rotary joint 25. The passage 21, the passage 23 and the passage 24 are connected to a pressure regulating unit 30 through respective valves V1-1, V3-1 and V4-1 and pressure regulators R1, R3 and R4. Further, the passage 21, the passage 23 and the passage 24 are connected to a vacuum source 31 through respective valves V1-2, V3-2 and V4-2 and are capable of communicating with the atmosphere through the respective valves V1-3, V3-3 and V4-3.

On the other hand, the passage 12 communicating with the ripple chamber 6 is connected to a passage 22 through the rotary joint 25. Then, the passage 22 is connected to the pressure regulating unit 30 through a gas-liquid separator 35, a valve V2-1 and a pressure regulator R2. Further, the passage 22 is connected to a vacuum source 131 through the gas-liquid separator 35 and a valve V2-2 and is capable of communicating with the atmosphere through the valve V2-3.

Further, a retainer ring pressure chamber 9 composed of an elastic membrane is formed immediately above the retainer ring 3, and the retainer ring pressure chamber 9 is connected via a passage 15 formed in the top ring body (carrier) 2 and the rotary joint 25 to the passage 26. Then, the passage 26 is connected to the pressure regulating unit 30 through a valve V5-1 and a pressure regulator R5. Further, the passage 26 is connected to the vacuum source 31 through a valve V5-2 and is capable of communicating with the atmosphere through a valve V5-3. The pressure regulators R1, R2, R3, R4 and R5 have pressure regulating function for regulating pressures of a pressurized fluid supplied from the pressure regulating unit 30 to the central chamber 5, the ripple chamber 6, the outer chamber 7, the edge chamber 8 and the retainer ring pressure chamber 9, respectively. The pressure regulators R1, R2, R3, R4 and R5 and the valves V1-1-V1-3, V2-1-V2-3, V3-1-V3-3, V4-1-V4-3 and V5-1-V5-3 are connected to the controller 50 (see FIG. 1), and operations of these pressure regulators and valves are controlled by the controller 50. Further, pressure sensors P1, P2, P3, P4 and P5 and flow rate sensors F1, F2, F3, F4 and F5 are provided in the passages 21, 22, 23, 24 and 26, respectively.

In the top ring 1 as shown in FIG. 2, the central chamber 5 is defined at the central portion of the top ring body 2, and the ripple chamber 6, the outer chamber 7 and the edge chamber 8 are concentrically defined in the order from the central portion to the peripheral portion of the top ring body 2. Pressures of the fluid supplied to the central chamber 5, the ripple chamber 6, the outer chamber 7, the edge chamber 8, and the retainer ring pressure chamber 9 are independently controlled by the pressure regulating unit 30 and the pressure regulators R1, R2, R3, R4 and R5. With this structure, the pressing forces for pressing the semiconductor wafer W against the polishing pad 101 can be adjusted at respective areas of the semiconductor wafer and the pressing force for pressing the polishing pad 101 by the retainer ring 3 can be adjusted.

Next, sequential polishing operations of the polishing apparatus shown in FIGS. 1 and 2 will be described below.

The top ring 1 receives and holds under vacuum a semiconductor wafer W from a substrate transfer device (pusher). Thereafter, the top ring 1 holding the semiconductor wafer W under vacuum is lowered to a preset polishing position of the top ring which has been set in advance. The retainer ring 3 is brought into contact with the surface (polishing surface) 101a of the polishing pad 101 at the preset polishing position. Before the semiconductor wafer W is polished, since the semiconductor wafer W is attracted to and held by the top ring 1, there is a small gap of about 1 mm, for example, between the lower surface (the surface to be polished) of the semiconductor wafer W and the polishing surface 101a of the polishing pad 101. At this time, the polishing table 100 and the top ring 1 are being rotated about their own axes. In this state, the elastic membrane 4 located at the upper surface (the reverse surface) of the semiconductor wafer W is inflated under the pressure of a fluid supplied thereto to press the lower surface (the surface to be polished) of the semiconductor wafer W against the polishing surface of the polishing pad 101. As the polishing table 100 and the top ring 1 are being moved relatively to each other, the lower surface (the surface to be polished) of the semiconductor wafer W is polished to a predetermined state, e.g., a predetermined film thickness. After polishing of the semiconductor wafer W is finished on the polishing pad 101, the top ring 1 holds the semiconductor wafer W under vacuum, and the top ring 1 is lifted and moved to the substrate transfer device (pusher), and then the polished semiconductor wafer W is removed (released) from the top ring 1.

Figure 3:
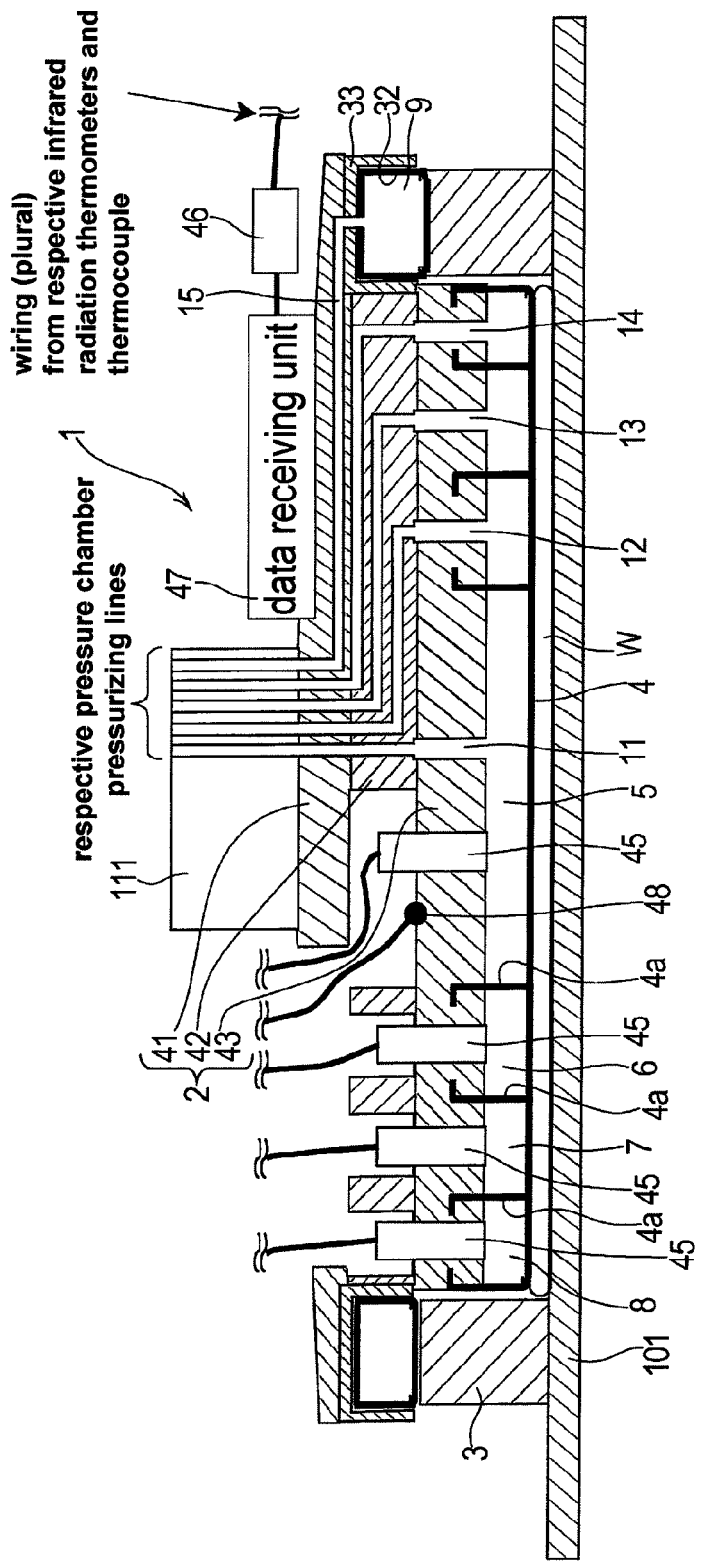
FIG. 3 is a schematic cross-sectional view showing main structural elements of the top ring.

FIG. 3 is a schematic cross-sectional view showing main structural elements of the top ring 1. As shown in FIG. 3, the top ring 1 basically comprises a top ring body 2 for pressing a semiconductor wafer (substrate) W against the polishing pad 101, and a retainer ring 3 for directly pressing the polishing surface 101a. The top ring body 2 comprises a top ring flange 41 located at an upper part, a top ring spacer 42 located at an intermediate part, and a carrier 43 located at a lower part.

The elastic membrane 4 has a plurality of concentric partition walls 4a, and a circular central chamber 5, an annular ripple chamber 6, an annular outer chamber 7 and an annular edge chamber 8 are defined by the partition walls 4a between the upper surface of the elastic membrane 4 and the lower surface of the top ring body 2. Specifically, the central chamber 5 is defined at the central portion of the top ring body 2, and the ripple chamber 6, the outer chamber 7 and the edge chamber 8 are concentrically defined in the order from the central portion to the peripheral portion of the top ring body 2. A passage 11 communicating with the central chamber 5, a passage 12 communicating with the ripple chamber 6, a passage 13 communicating with the outer chamber 7 and a passage 14 communicating with the edge chamber 8 are formed in the top ring body 2. Then, the passage 11 communicating with the central chamber 5, the passage 12 communicating with the ripple chamber 6, the passage 13 communicating with the outer chamber 7 and the passage 14 communicating with the edge chamber 8 are connected via the rotary joint 25 (see FIG. 1) to respective pressure chamber pressurizing lines (not shown). The respective pressure chamber pressurizing lines are connected to the pressure regulating unit 30 (see FIG. 2) through the pressure regulators R1, R2, R3 and R4 (see FIG. 2).

Further, a retainer ring pressure chamber 9 is formed by an elastic membrane 32 immediately above the retainer ring 3. The elastic membrane 32 is housed in a cylinder 33 fixed to the top ring flange 41. The retainer ring pressure chamber 9 is connected via a passage 15 formed in the top ring body 2 and the rotary joint 25 (see FIG. 1) to the pressure chamber pressurizing line (not shown). Then, the pressure chamber pressurizing line for the retainer ring pressure chamber 9 is connected via the pressure regulator R5 (see FIG. 2) to the pressure regulating unit 30 (see FIG. 2).

As shown in FIG. 3, four infrared radiation thermometers 45 are provided in the carrier 43 of the top ring 1. Specifically, the four infrared radiation thermometers 45 face the central chamber 5, the ripple chamber 6, the outer chamber 7 and the edge chamber 8, respectively so that the infrared radiation thermometers 45 can measure temperatures at the respective portions of the membrane 4 corresponding to the respective pressure chambers 5, 6, 7 and 8. Further, a thermocouple 48 is attached to the upper surface of the carrier 43 of the top ring 1 so that the thermocouple 48 can measure a temperature of the carrier 43. The respective infrared radiation thermometers 45 and the thermocouple 48 are connected to a cold junction temperature sensor unit 46 through wiring.

According to the present invention, the temperatures of the membrane 4 are measured by the infrared radiation thermometers 45, and the temperature of the substrate is estimated using the measured temperatures of the membrane. A thermopile element is installed in the infrared radiation thermometer 45. An infrared light radiated from the membrane 4 as an object to be measured is incident on the thermopile element, and a thermal electromotive force corresponding to a quantity of the infrared light incident on the thermopile element is outputted. In the present embodiment, the thermal electromotive force corresponding to K thermocouple output is outputted. This thermal electromotive force is applied to the cold junction temperature sensor unit 46 through a wiring from the infrared radiation thermometer 45. The cold junction temperature sensor unit 46 has a sensor for measuring a temperature of the atmosphere. The thermal electromotive force is converted into a temperature corresponding to the K thermocouple in the cold junction temperature sensor unit 46, and a temperature obtained by adding the measured cold junction temperature to the converted temperature becomes measurement temperature. The cold junction temperature sensor unit 46 has an analog-to-digital converter, and the measurement temperature is converted into a digital signal by the analog-to-digital converter, and then the digital signal is transmitted to a data receiving unit 47.

Since the thermal electromotive force from the infrared radiation thermometer 45 is very small, measures against noise such as winding a shielded wire around the wiring are taken. Further, in the case where the thermocouple output is connected by a connector, it is necessary to produce the connector from a metal which is the same kind as the K thermocouple. In this manner, a quantity of the infrared light radiated from the membrane 4 is measured, but a difference occurs between the measured value and an actual membrane temperature. Because the upper surface of the membrane 4 has a certain level of reflectance of the infrared light in many cases, the infrared light radiated from the carrier 43 of the top ring 1 is reflected from the membrane 4, and the reflected light is measured by the infrared radiation thermometer 45. Therefore, the infrared radiation thermometer 45 is influenced by both of the infrared light from the membrane 4 and the infrared light from the carrier 43. In order to minimize this influence, surface texturing is applied to the upper surface of the membrane to lower the reflectance of the infrared light, thereby improving measurement accuracy. The surface texturing is a processing for forming minute unevenness on the surface of the membrane. By forming minute unevenness on the upper surface of the membrane to make surface roughness of the upper surface of the membrane rough, the reflectance of the infrared light can be lowered. Therefore, the infrared light radiated from the carrier 43 to the membrane 4 can be prevented from being reflected from the membrane 4. Thus, the infrared radiation thermometer 45 can measure a quantity of the infrared light radiated from the membrane 4 as an object to be measured with high accuracy. In this manner, the reflectance of the membrane 4 can be lowered to diminish the effect of the infrared light from the carrier 43, and the temperature of the membrane 4 is measured by the infrared radiation thermometer 45, and then the temperature of the substrate can be estimated using the measured temperature of the membrane.

Further, in the case where surface texturing is not applied to the upper surface of the membrane, the infrared radiation thermometer 45 is influenced by both of the infrared light from the membrane 4 and the infrared light from the carrier 43. Therefore, by measuring the temperature of the carrier 43 with the thermocouple 48 and using the measured value of the infrared radiation thermometer 45 and the measured value of the thermocouple 48, the temperature of the wafer can be estimated with high accuracy. The temperature measurement of the carrier may be carried out by a noncontact-type thermometer in the same manner as that of the membrane or by a contact-type thermocouple. In the case of using the contact-type thermocouple, the thermocouple is connected to the cold junction temperature sensor unit 46 as in the case of the infrared radiation thermometer 45 for measuring the temperature of the membrane, and the measured temperature is transmitted to the data receiving unit.

Figure 4:
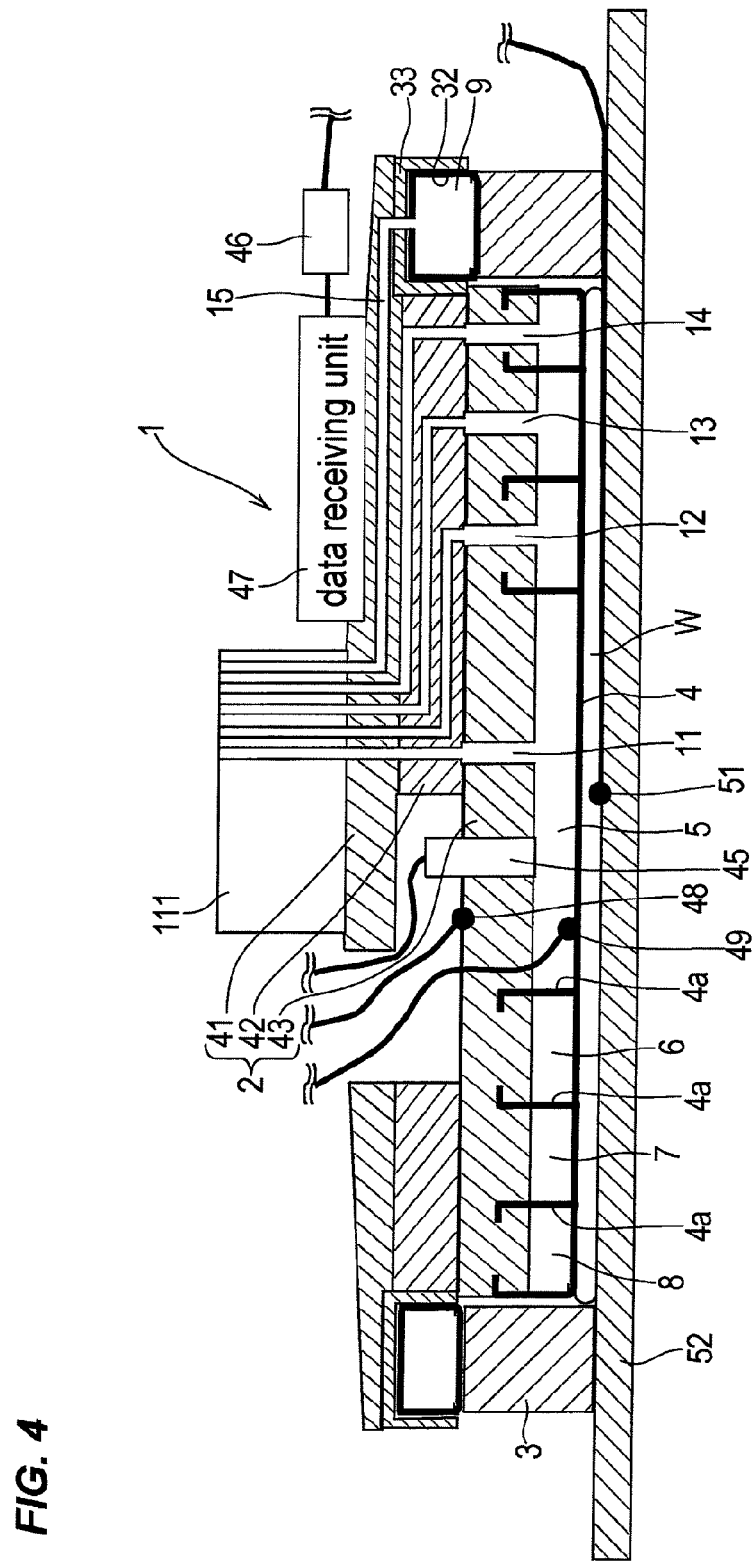
FIG. 4 is a schematic cross-sectional view showing an experimental apparatus for measuring temperature of a wafer, temperature of a membrane, temperature of a carrier, and the like when a semiconductor wafer (substrate) is heated and cooled.

Next, a method for calculating an estimate value of wafer temperature using the measured value of the infrared radiation thermometer and the measured value of the carrier temperature will be describe below. FIG. 4 is a schematic cross-sectional view showing an experimental apparatus for measuring temperature of the wafer, temperature of the membrane, temperature of the carrier, and the like when a semiconductor wafer (substrate) W is heated and cooled. As shown in FIG. 4, an infrared radiation thermometer 45 is installed in the carrier 43 of the top ring 1. A thermocouple 48 is attached to the upper surface of the carrier 43. A thermocouple 49 is attached to the upper surface of the membrane 4. A thermocouple 51 is attached to a lower surface of the semiconductor wafer W. Further, a wafer heating and cooling device 52 for heating and cooling the semiconductor wafer W is provided.

The lower surface of the semiconductor wafer W is heated by forced heating, and then cooled by forced cooling by using the experimental apparatus shown in FIG. 4, and the measured value of the temperature of the wafer lower surface by the thermocouple, the measured value of the temperature of the membrane upper surface by the thermocouple, the measured value of the infrared radiation thermometer, and the measured value of the temperature of the carrier are obtained. Specifically, the temperature of the wafer lower surface is measured by the thermocouple 51, the temperature of the membrane upper surface is measured by the thermocouple 49, the infrared radiation temperature is measured by the infrared radiation thermometer 45, and the temperature of the carrier is measured by the thermocouple 48. In this case, it is considered that the measured value obtained by the contact-type thermocouple has the smallest error. In FIG. 4, although the thermometer is provided only in the central chamber 5 for simplifying explanation, respective temperatures in other pressure chambers such as the ripple chamber 6, the outer chamber 7, and the like may be measured simultaneously.

FIG. 5 is a graph in which time variations of the temperatures are plotted when the lower surface of the semiconductor wafer (substrate) W is heated by forced heating, and then cooled by forced cooling using the experimental apparatus shown in FIG. 4. As shown in FIG. 5, because the semiconductor wafer is heated by forced heating from the lower surface side of the semiconductor wafer, temperature rise of the semiconductor wafer is the fastest, and then temperature rise of the upper surface of the membrane occurs, and temperature rise of the carrier is the slowest. Thereafter, in the case where the lower surface side of the semiconductor wafer is shifted to the forced cooling, temperature drop of the semiconductor wafer is the fastest, and then temperature drop of the upper surface of the membrane occurs, and temperature drop of the carrier is the slowest. The measured values of the infrared radiation thermometer and the measured values of the upper surface of the membrane show approximately the same tendency at the time of heating and at the time of cooling.

Figure 6A:
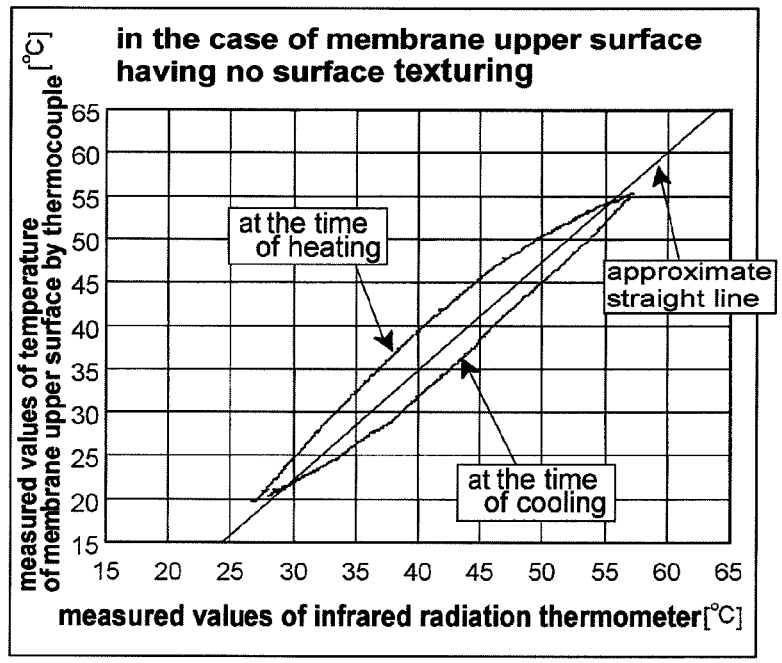
FIGS. 6A and 6B are graphs in which the measured values of the infrared radiation thermometer are plotted on the horizontal axis and the measured values of the temperature of the membrane upper surface by the thermocouple at the same time are plotted on the vertical axis using all time-series data shown in FIG. 5.
Figure 6B:
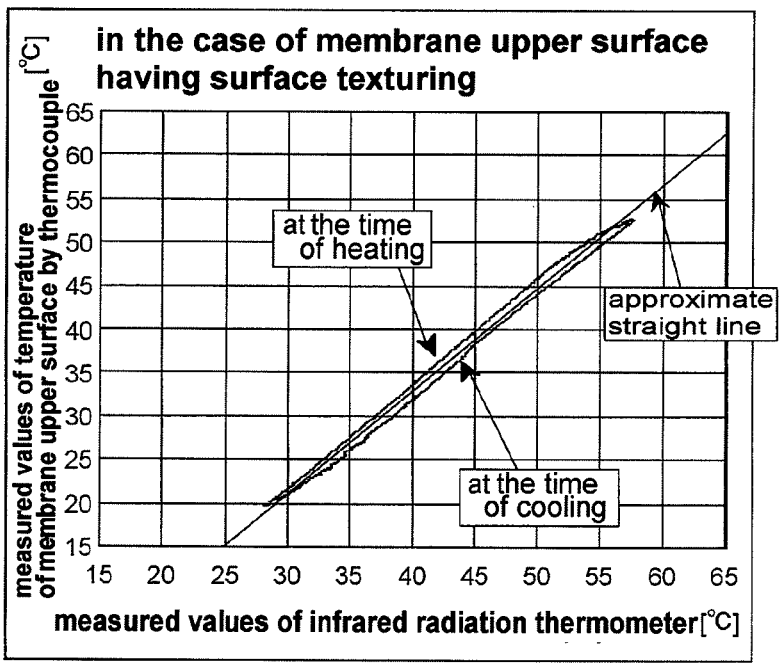

FIGS. 6A and 6B are graphs in which the measured values of the infrared radiation thermometer are plotted on the horizontal axis and the measured values of the temperature of the membrane upper surface by the thermocouple at the same time are plotted on the vertical axis using all time-series data shown in FIG. 5. FIG. 6A shows the measured results in the pressure chamber having no surface texturing on the upper surface of the membrane, and FIG. 6B shows the measured results in the pressure chamber having surface texturing (surface roughing processing is applied) on the upper surface of the membrane. As shown in FIG. 6A, in the case of the membrane upper surface having no surface texturing, there is some deviation between the measured values of the infrared radiation thermometer and the measured values of the temperature of the membrane upper surface by the thermocouple at the time of heating and at the time of cooling, and thus the plotted results become gentle curves. As shown in FIG. 6B, in the case of the membrane upper surface having surface texturing, there is some deviation between the measured values of the infrared radiation thermometer and the measured values of the temperature of the membrane upper surface by the thermocouple at the time of heating and at the time of cooling, and thus the plotted results become gentle curves. However, in FIG. 6B, because the degree of the deviation is small, the plotted results become curves close to a straight line. In this manner, in both of the pressure chamber having no surface texturing and the pressure chamber having surface texturing, there is some deviation between the measured values of the temperature of the membrane by the infrared radiation thermometer and the measured values of the temperature of the membrane by the thermocouple, and therefore the effect of the deviation is removed by linear approximation. Specifically, An output value of thermocouple (estimate value of membrane temperature)=coefficient $a$×the measured value of the infrared radiation thermometer+coefficient $b$   equation (1)

By obtaining the coefficient a and the coefficient b which satisfy the relationship of the equation (1), the temperature of the membrane can be estimated by simple linear regression analysis. Hereinafter, the estimate value of the temperature of the membrane by the simple linear regression equation is referred to as correction value of the infrared radiation thermometer measurement.

Figure 7A:
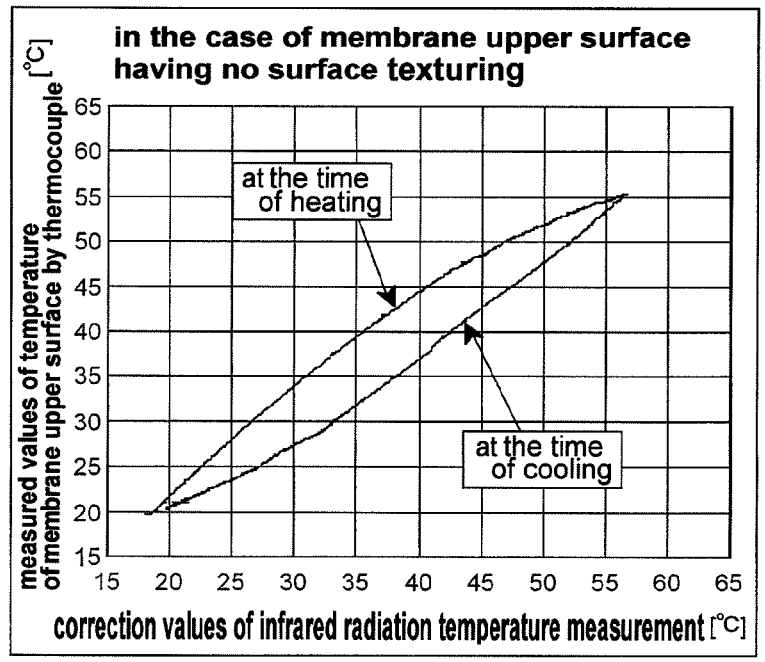
FIGS. 7A and 7B are graphs in which the correction values of the infrared radiation temperature measurement are plotted on the horizontal axis and the measured values of the temperature of the membrane upper surface at the same time by the thermocouple are plotted on the vertical axis.
Figure 7B:
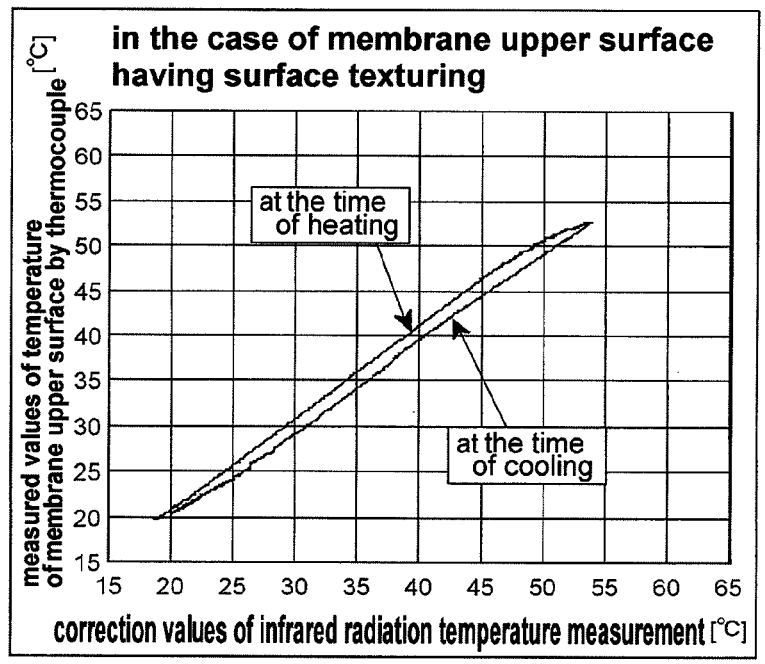

FIGS. 7A and 7B are graphs in which the correction values of the infrared radiation temperature measurement are plotted on the horizontal axis and the measured values of the temperature of the membrane upper surface at the same time by the thermocouple are plotted on the vertical axis. Specifically, FIGS. 7A and 7B are graphs showing the relationship between the correction values of the infrared radiation thermometer measurement and the measured values of the thermocouple after linear approximation. FIG. 7A shows the results at the area having no surface texturing on the upper surface of the membrane, and FIG. 7B shows the results at the area having surface texturing on the upper surface of the membrane.

FIG. 7A shows that the correction values of the membrane temperature measurement by the infrared radiation thermometer are lower than the actual membrane temperatures measured by the thermocouple at the time of forced heating. Specifically, because temperature rise of the carrier is delayed at the time of forced heating, the infrared light radiated from the low-temperature carrier is reflected from the membrane, and the reflected infrared light is incident on the infrared radiation thermometer. Therefore, the correction values of the measurement are lower than the actual membrane temperatures. In contrast, the correction values of the membrane temperature measurement by the infrared radiation thermometer are higher than the actual membrane temperatures measured by the thermocouple at the time of forced cooling. Specifically, because temperature drop of the carrier is delayed at the time of forced cooling, the infrared light radiated from the high-temperature carrier is reflected from the membrane, and the reflected infrared light is incident on the infrared radiation thermometer. Therefore, the correction values of the measurement are higher than the actual membrane temperatures.

In FIG. 7B, because surface texturing is applied to the upper surface of the membrane, the infrared light radiated from the carrier is diffusely reflected from the upper surface of the membrane, and thus the effect of the reflected infrared light on the measured values of the infrared radiation thermometer becomes small. Therefore, the actual membrane temperatures measured by the thermocouple and the correction values of the membrane temperature measurement by the infrared radiation thermometer coincide generally with each other at the time of forced heating and at time of forced cooling. Thus, it can be confirmed that in the membrane having the upper surface to which surface texturing is applied, the membrane temperature can be estimated with relatively high accuracy by the infrared radiation thermometer.

As described above, FIGS. 7A and 7B show that especially in the case where surface texturing is not applied to the upper surface of the membrane, when the infrared light radiated from the carrier is reflected from the upper surface of the membrane to exert a large influence on the measured values of the infrared radiation thermometer, the membrane temperature cannot be estimated with high accuracy from the correction value of the measurement by the infrared radiation thermometer. In this manner, because the measured values of the infrared radiation thermometer are affected by the temperature of the carrier, the estimate value of the membrane temperature is calculated by multiple linear regression analysis which uses the correction values of the infrared radiation thermometer measurement and the measured values of the carrier temperature. In this multiple linear regression analysis, regression coefficients $b_0$, $b_1$ and $b_2$ which minimize (the measured value of the membrane temperature by the thermocouple−the estimate value of the membrane temperature)² are calculated. Specifically, the multiple linear regression analysis which uses a method of least squares is employed.

(The estimate value of the membrane temperature)= $b_0+b_1\times$(the correction value of the infrared radiation thermometer measurement)+$b_2\times$(the measured value of the carrier temperature)   equation (2)

Figure 8A:
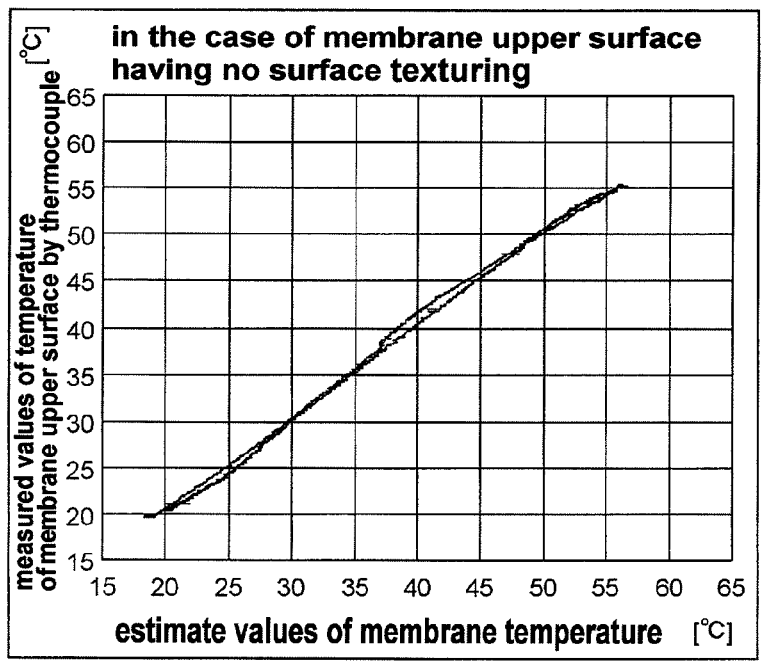
FIGS. 8A and 8B are graphs in which the estimate values of the membrane temperature calculated by a membrane temperature estimate equation are plotted on the horizontal axis and the measured values of the temperature of the membrane upper surface by the thermocouple at the same time are plotted on the vertical axis.
Figure 8B:
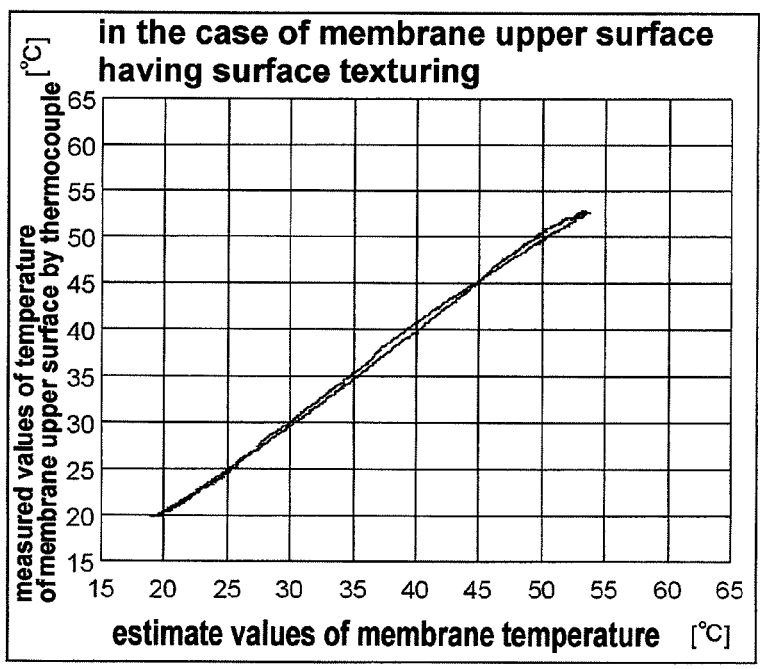

FIGS. 8A and 8B are graphs in which the estimate values of the membrane temperature are plotted on the horizontal axis and the measured values of the temperature of the membrane upper surface by the thermocouple at the same time are plotted on the vertical axis in the case where regression coefficients $b_0$, $b_1$ and $b_2$ which minimize (the measured value of the membrane temperature by the thermocouple−the estimate value of the membrane temperature)² by multiple linear regression analysis represented by the equation (2) are calculated by application of the actual measured values. FIG. 8A shows the case in which the membrane upper surface does not have surface texturing, and FIG. 8B shows the case in which the membrane upper surface has surface texturing.

As shown in FIGS. 8A and 8B, in the case where the membrane temperature is estimated using the multiple linear regression equation, the estimate value of the membrane temperature can coincide with the actual measured value of the membrane temperature by the thermocouple with extremely high accuracy. By storing the calculated multiple regression coefficients in the polishing apparatus in advance, the membrane temperature can be estimated with high accuracy during the polishing process. Further, FIG. 8B shows the results in the case where the estimate values are calculated by the multiple linear regression analysis using the data of FIG. 7B in which surface texturing is applied to the upper surface of the membrane. The estimate values of the case of FIG. 8B can coincide with the actual measured values of the membrane temperature by the thermocouple with higher accuracy than those of the case of FIG. 7B. Specifically, the multiple linear regression analysis which takes into account the carrier temperature is effective also in the area where surface texturing is applied.

Figure 9:
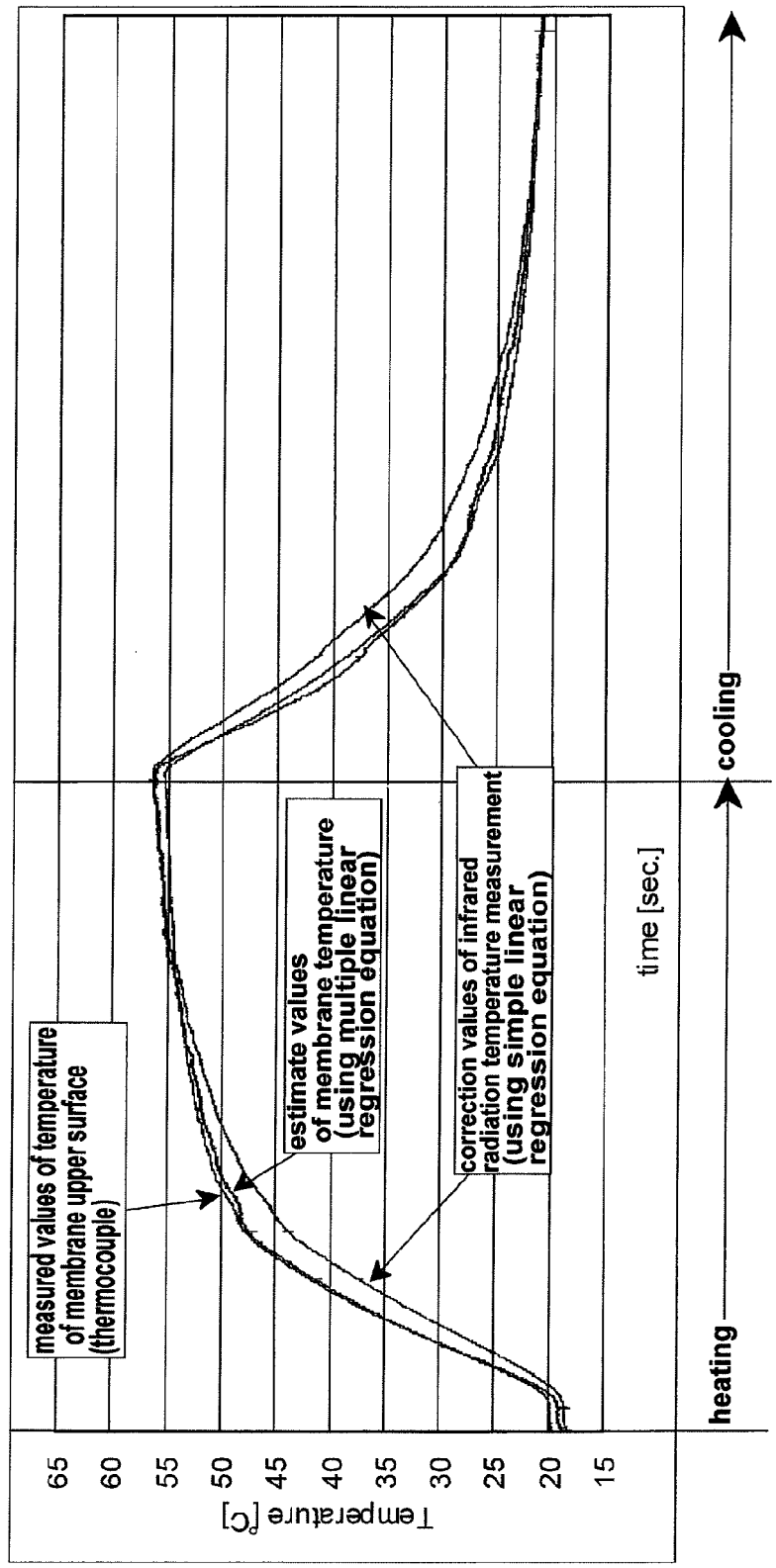
FIG. 9 is a graph showing the results in which the membrane temperatures are estimated from the measured values of the infrared radiation thermometer and the measured values of the carrier temperature in FIG. 5 by using the multiple linear regression equation.

FIG. 9 is a graph showing the results in which the membrane temperatures are estimated from the measured values of the infrared radiation thermometer and the measured values of the carrier temperature in FIG. 5 by using the multiple linear regression equation. In FIG. 9, measurement is carried out at the area having no surface texturing. It is confirmed from FIG. 9 that although there are locations where the correction values of the infrared radiation thermometer measurement which are correction values by liner approximation (simple linear regression equation) in the case of FIG. 7A are different from the actual measured values of the membrane temperature by the thermocouple, the estimate values of the membrane temperature obtained by using the multiple linear regression equation coincide with the actual measured values of the membrane temperature by the thermocouple with extremely high accuracy.

Figure 10:
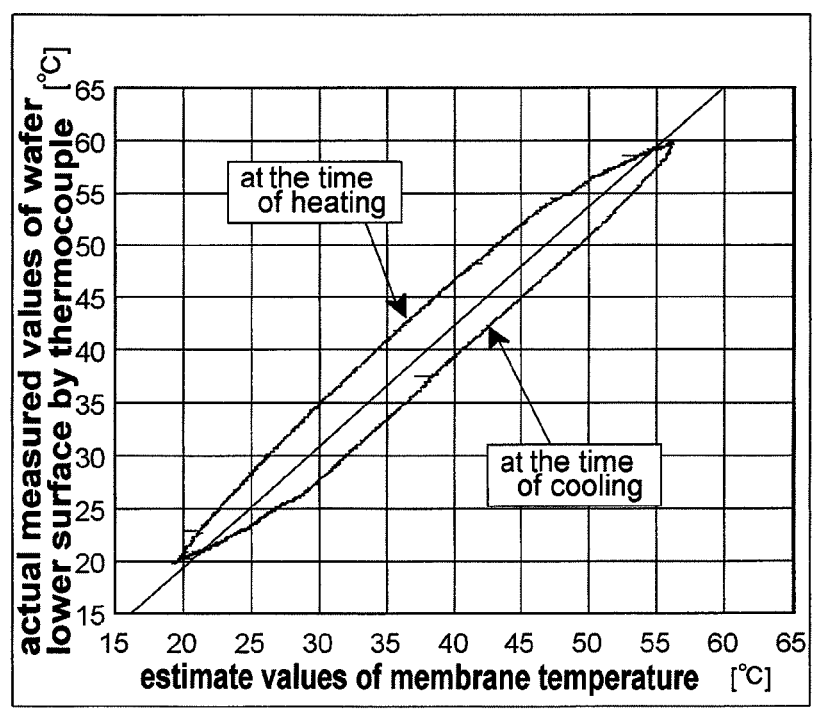
FIG. 10 is a graph in which the estimate values of the membrane temperature calculated by the membrane temperature estimate equation are plotted on the horizontal axis and the measured values of the temperature of the wafer lower surface by the thermocouple at the same time are plotted on the vertical axis using all time-series data shown in FIG. 5.

Next, a method for estimating wafer temperature (substrate temperature) using the estimate value of the membrane temperature will be described below. FIG. 10 is a graph in which the estimate values of the membrane temperature calculated by the above membrane temperature estimate equation (2) are plotted on the horizontal axis and the measured values of the temperature of the wafer lower surface by the thermocouple at the same time are plotted on the vertical axis using all time-series data shown in FIG. 5. FIG. 10 shows that the estimate values of the membrane temperature are lower than the actual measured values of wafer temperature by the thermocouple at the time of forced heating. In contrast, the estimate values of the membrane temperature are higher than the actual measured values of wafer temperature by the thermocouple at the time of forced cooling. This phenomenon will be described below.

The membrane temperature is affected by both of the wafer temperature and the carrier temperature from the standpoint of thermal balance. The membrane temperature is lower than the wafer temperature by the effect of the low-temperature carrier at the time of forced heating. In contrast, the membrane temperature is higher than the wafer temperature by the effect of the high-temperature carrier at the time of forced cooling.

In FIG. 10, the estimate values of the membrane temperature may be determined by the simple linear regression analysis of the equation (1), and the estimate values of the wafer temperature may be determined by the simple linear regression analysis from the correction values of the infrared radiation thermometer measurement. In this case also, especially in the case where surface texturing is applied to the upper surface of the membrane, when the infrared light radiated from the carrier is diffusely reflected from the upper surface of the membrane, the wafer temperature can be estimated with high accuracy. A certain level of estimation of the wafer temperature can be made by the simple linear regression equation which uses the estimate values of the membrane temperature. In order to estimate the wafer temperature with higher accuracy, the estimate value can be calculated with high accuracy by estimating the wafer temperature by the multiple linear regression equation which uses the membrane temperature and the carrier temperature. In this multiple linear regression analysis also, regression coefficients $b_0$, $b_1$ and $b_2$ which minimize (the measured value of the wafer temperature by the thermocouple−the estimate value of the wafer temperature)² are calculated. Specifically, the multiple linear regression analysis which uses a method of least squares is employed.

(The estimate value of the wafer temperature)=$b_0+b_1\times$(the estimate value of the membrane temperature)+$b_2\times$(the measured value of the carrier temperature)   equation (3)

Figure 11:
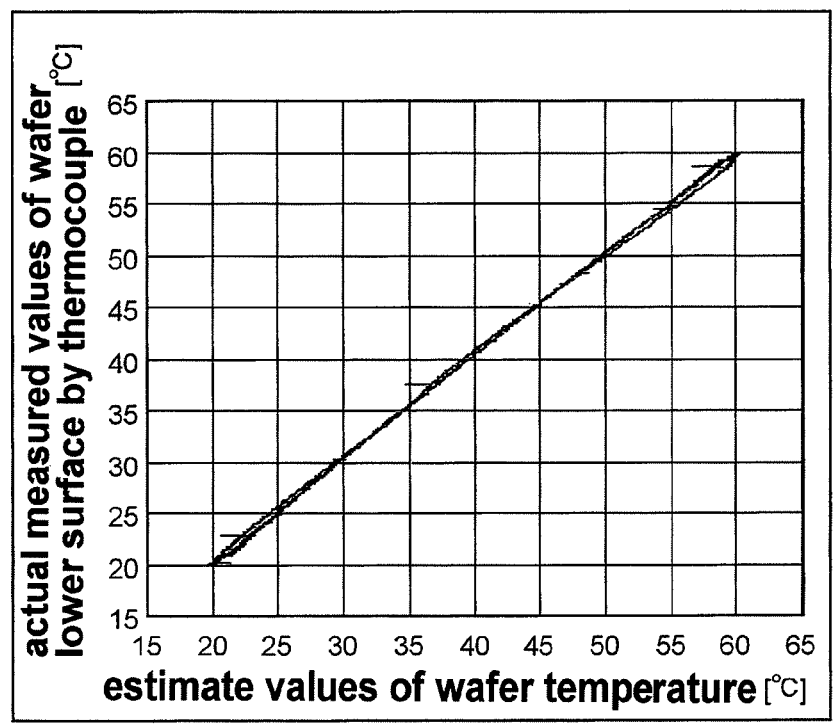
FIG. 11 is a graph in which the estimate values of the wafer temperature are plotted on the horizontal axis and the measured values of the temperature of the wafer lower surface by the thermocouple at the same time are plotted on the vertical axis.

FIG. 11 is a graph in which the estimate values of the wafer temperature are plotted on the horizontal axis and the measured values of the temperature of the wafer lower surface by the thermocouple at the same time are plotted on the vertical axis in the case where regression coefficients $b_0$, $b_1$ and $b_2$ which minimize (the measured value of the wafer temperature by the thermocouple−the estimate value of the wafer temperature)² by the above equation (3) are calculated by application of the actual measured values. In the case where the wafer temperature is estimated using the multiple linear regression equation (3), the estimate values of the wafer temperature can coincide with the actual measured values of the temperature of the wafer lower surface by the thermocouple with extremely high accuracy.

Figure 12:
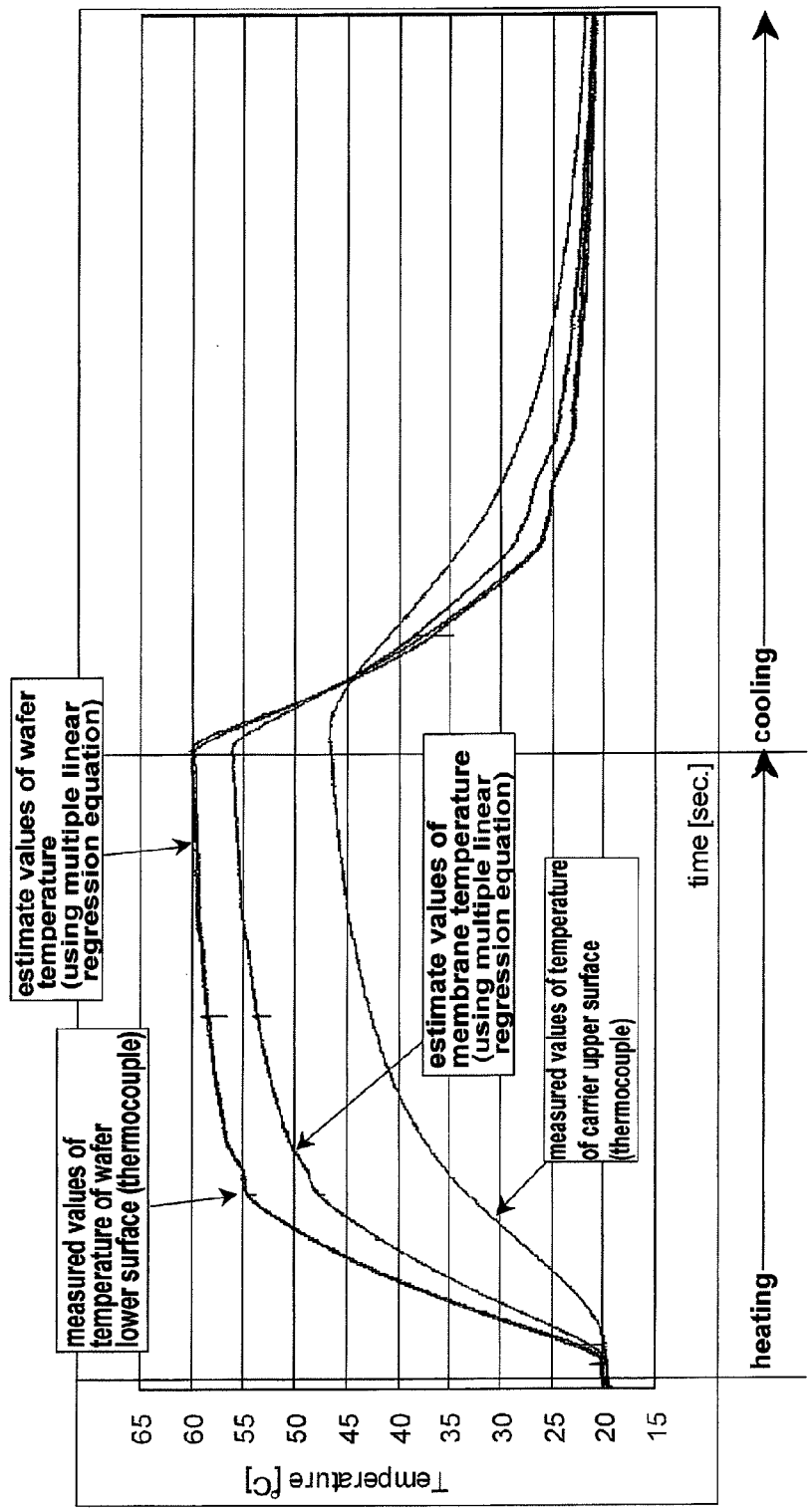
FIG. 12 is a graph showing the results in which the wafer temperatures are estimated using the multiple linear regression equation from the measured values of the infrared radiation thermometer and the measured values of the carrier temperature in the case of FIG. 5.

FIG. 12 is a graph showing the results in which the wafer temperatures are estimated using the multiple linear regression equation from the measured values of the infrared radiation thermometer and the measured values of the carrier temperature in the case of FIG. 5. It is confirmed that the estimate values of the wafer temperature obtained by using the multiple linear regression equation coincide with the actual measured values of the temperature of the wafer lower surface by the thermocouple with extremely high accuracy. By storing the calculated multiple regression coefficients in the polishing apparatus in advance, the wafer temperature can be estimated with high accuracy during the polishing process. In a preliminary experiment for determining multiple regression coefficients as shown in FIG. 4, it is desirable that the pressure chamber is pressurized by the same pressure as that for actual polishing. Further, in the case where the actual polishing (polishing performed actually) is carried out under some pressure conditions, multiple regression coefficients may be calculated for each pressure condition in advance, and the multiple regression coefficients may be selectively used in accordance with the pressure condition at the time of actual polishing. In the present embodiment, the multiple linear regression analysis incorporating the carrier temperature as a typical temperature of the substrate holding apparatus (top ring) has been performed. In order to calculate the estimate value of the temperature with high accuracy, it is desirable to use the temperature of the portion of the carrier facing the membrane. However, the temperature of other portions (member) of the substrate holding apparatus may be used instead of the carrier temperature. In this case, if the temperature of the member connected to the carrier is used, the estimate value of the temperature can be calculated with relatively high accuracy.

Figure 13:
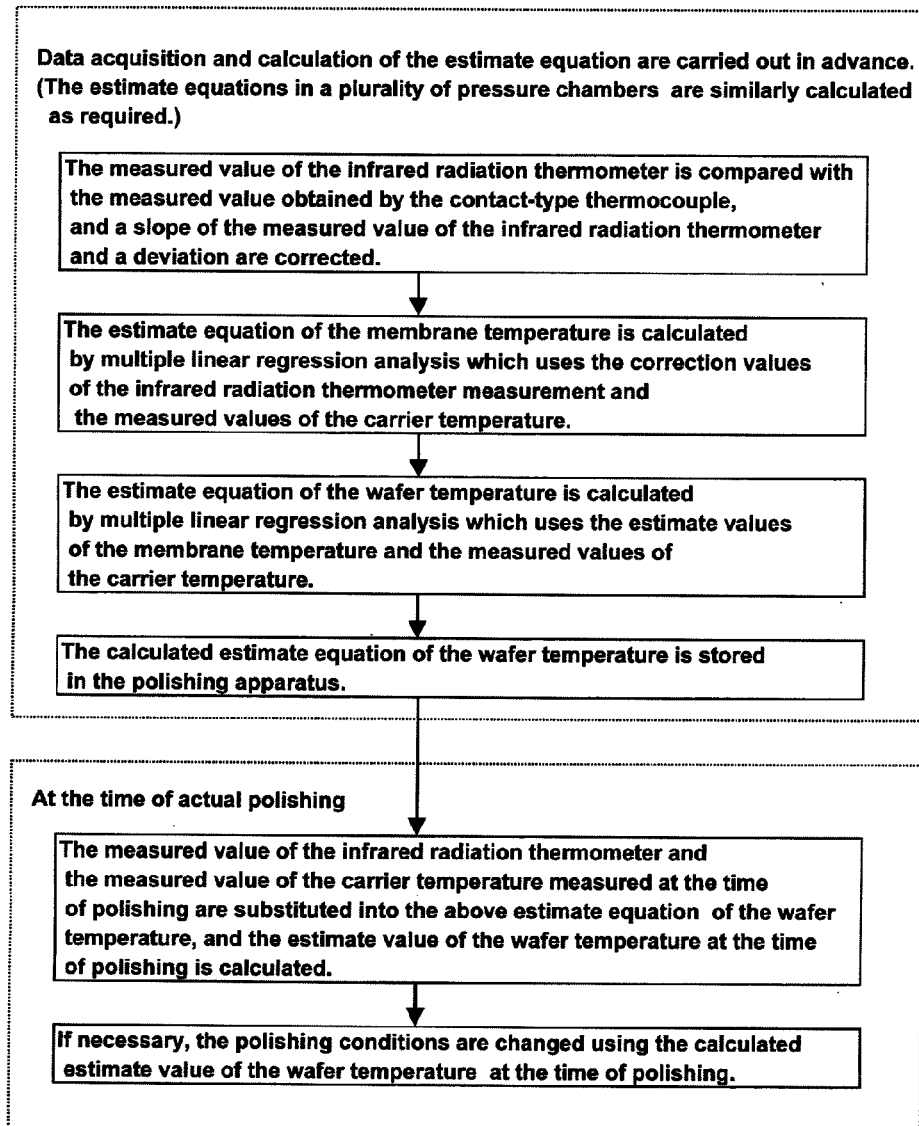
FIG. 13 is a flow chart showing one aspect of a process for determining polishing conditions and the like by estimating the wafer temperature from the measured value of the infrared radiation thermometer and the measured value of the carrier temperature performed in the polishing apparatus according to the present invention.

FIG. 13 is a flow chart showing one aspect of a process for determining polishing conditions and the like by estimating the wafer temperature (substrate temperature) from the measured value of the infrared radiation thermometer and the measured value of the carrier temperature performed in the polishing apparatus according to the present invention.

As shown in FIG. 13, data acquisition and calculation of the estimate equation are carried out in advance. Specifically, as in the case of FIG. 4, the temperature of the wafer lower surface is measured by the thermocouple 51, the temperature of the membrane upper surface is measured by the thermocouple 49, the infrared radiation temperature is measured by the infrared radiation thermometer 45, and the temperature of the carrier is measured by the thermocouple 48. Next, the estimate equation is calculated using these measured values. In this case, the estimate equations in a plurality of pressure chambers are similarly calculated as required. The measured value of the infrared radiation thermometer is compared with the measured value obtained by the contact-type thermocouple, and a slope of the measured value of the infrared radiation thermometer and a deviation between the measured value of the infrared radiation thermometer and the measured value obtained by the contact-type thermocouple are corrected. Then, the estimate equation of the membrane temperature is calculated by multiple linear regression analysis which uses the correction values of the infrared radiation thermometer measurement and the measured values of the carrier temperature.

Then, the estimate equation of the wafer temperature is calculated by multiple linear regression analysis which uses the estimate values of the membrane temperature and the measured values of the carrier temperature. Thereafter, the calculated estimate equation of the wafer temperature is stored in the polishing apparatus.

At the time of actual polishing, the measured value of the infrared radiation thermometer and the measured value of the carrier temperature measured at the time of polishing are substituted into the above estimate equation of the wafer temperature, and the estimate value of the wafer temperature at the time of polishing is calculated. If necessary, the polishing conditions are changed using the calculated estimate value of the wafer temperature at the time of polishing.

Next, a problem of dew condensation in the membrane which has been explained in Summary of the Invention will be described below. The dew condensation in the membrane lowers accuracy of temperature measurement or destabilizes pressures applied to the wafer.

Figure 14A:
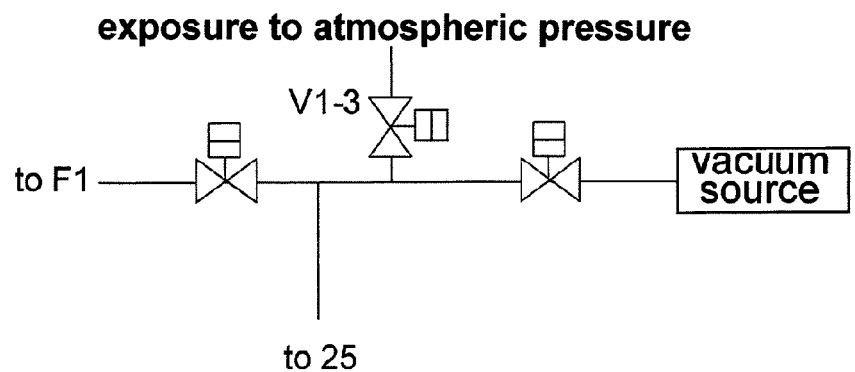
FIG. 14A is an enlarged view of XIV part of FIG. 2

FIG. 14A is an enlarged view of XIV part of FIG. 2. As shown in FIG. 14A, the valve V1-3 is capable of communicating with the atmosphere. When the passage communicating with the pressure chamber (for example, the central chamber) is switched from the vacuum state to the state of the pressure release to an atmospheric pressure, air in the atmosphere in which the polishing apparatus is placed enters the passage from the valve V1-3 to expose the pressure chamber to an atmospheric pressure. At this time, air containing water content enters the pressure chamber, and dew condensation occurs in the membrane by repetition of temperature rise and temperature drop of the gas in the above pressure chamber. The same holds true for the valve V2-3 and the like corresponding to other pressure chambers (for example, the ripple chamber 6). When dew condensation occurs in the membrane of the pressure chamber to generate water droplets on the upper surface of the membrane, a quantity of the infrared light radiated from the portion having the water droplets is varied in comparison with the case where there is no water droplets. Therefore, the membrane temperature cannot be measured with high accuracy. Further, when an amount of water droplets caused by dew condensation increases, water is accumulated in the pressure chamber to change a pressure applied to the wafer (substrate), and thus stable polishing cannot be carried out.

In order to prevent air containing water content from entering the pressure chamber, an atmospheric-pressure $N_2$ (dry gas) is supplied when a pressure in the pressure chamber increases from the vacuum state to an atmospheric pressure. Dry air containing no water content, other than $N_2$, may be used. In this case, the dry air means a gas source whose dew-point temperature under atmospheric pressure is not more than 20° C. Deionized water (pure water) used for cleaning the top ring has a temperature of approximately 20° C., normally, and if a gas whose dew-point temperature is not more than 20° C. is used, dew condensation does not occur even if the gas is cooled down to approximately 20° C. The dry gas is preferably an inert gas.

Figure 14B:
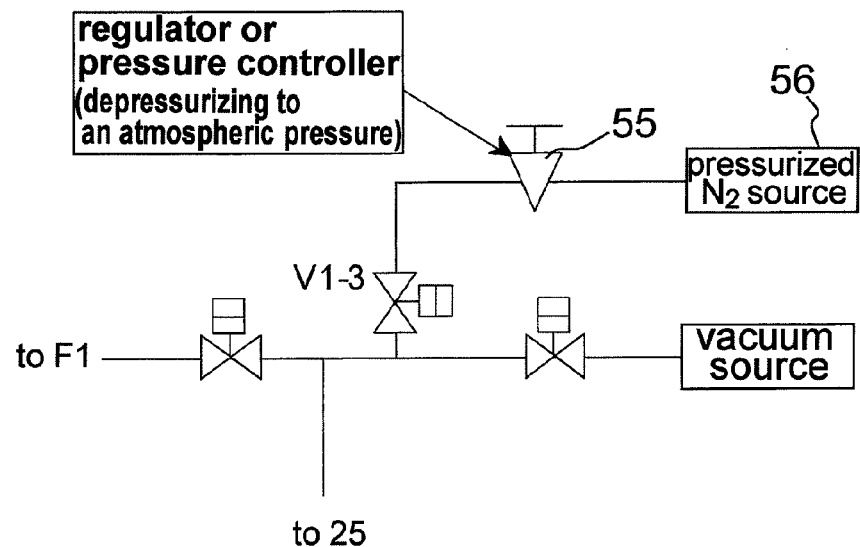
FIG. 14B is a view showing a piping system for supplying $N_2$ having an atmospheric pressure into the pressure chamber.

FIG. 14B is a view showing a piping system for supplying $N_2$ having an atmospheric pressure into the pressure chamber. As shown in FIG. 14B, the valve V1-3 is connected via a regulator or a pressure controller 55 to a pressurized $N_2$ source 56. The regulator or the pressure controller 55 depressurizes a pressurized $N_2$ supplied from the pressurized $N_2$ source 56 to an atmospheric pressure. In this manner, in order to supply an atmospheric-pressure $N_2$ to the pressure chamber, the pressurized $N_2$ may be depressurized to an atmospheric-pressure $N_2$ by the regulator (decompression valve) or the pressure controller. In contrast, when the pressure chamber is depressurized from the pressurized state to an atmospheric pressure, the valve V1-3 communicating with the pressure chamber is opened, and the pressurized gas is discharged from a relief valve of the regulator and is depressurized. Thus, air containing water content is prevented from entering the passage. Further, a container for storing an atmospheric-pressure $N_2$ may be provided, and the atmospheric-pressure $N_2$ may be supplied from the container to the pressure chamber to heighten responsiveness upon change to the atmospheric pressure. According to the present invention, the passage communicating with the pressure chamber is connected only to the gas source isolated from the atmosphere in which the polishing apparatus is placed. Specifically, because the passage communicating with the pressure chamber is constructed such that the passage is not connected to the atmosphere in which the polishing apparatus is placed, water content in the air does not enter the passage to prevent dew condensation from occurring in the pressure chamber.

Also, in the aspect in which a dry gas source is not provided as shown in FIG. 2, a water content removing device may be provided in the passages (passages 21, 22, 23 and 24 or passages 11, 12, 13 and 14 in the embodiment of FIG. 2) communicating with the pressure chamber in which the infrared radiation thermometer is installed, thereby supplying a gas whose dew-point temperature is not more than 20° C. to each pressure chamber. As the water content removing device, water-absorbing material such as silica gel or water absorptive polymer is provided in the passage, and the water-absorbing material is replaced with new one simultaneously with replacement of the membrane or the like. As other means, in order to prevent dew condensation from occurring in the pressure chamber side, it is considered that the membrane itself is constructed by a membrane having high thermal insulation or warm water is used for cleaning the top ring, thereby preventing the temperature of the membrane from lowering.

Next, the data receiving unit 47 shown in FIG. 3 will be described below. As shown in FIG. 3, the data receiving unit 47 is installed in the top ring 1 which rotates during the polishing process, and thus it is necessary to transmit signals between a rotating part and a stationary part for signal transmission between the controller of the polishing apparatus and the data receiving unit 47. For this signal transmission, a slip ring may be used or radio communication such as electric wave communication or optical communication may be used (not shown). According to the present embodiment, signals measured by the infrared radiation thermometer 45 or the thermocouple 48 are converted into digital signals by the analog-to-digital converter of the cold junction temperature sensor unit 46, and the digital signals are transmitted to the data receiving unit 47. Then, the digital signals are transmitted from the data receiving unit 47 to the controller 50 of the polishing apparatus (see FIG. 1), and thus this system is unsusceptible to noise caused by the slip ring or the radio communication. A slip ring may be used for power supply to the data receiving unit 47, or noncontact power supply to the data receiving unit 47 may be performed using coils or the like. Further, a rechargeable battery may be provided in the top ring 1 to supply power. In this case, the remaining battery level may be recognized by the controller 50 of the polishing apparatus, and an alarm for notifying replacement of the battery when the remaining battery level is low may be issued from the polishing apparatus.

Figure 15:
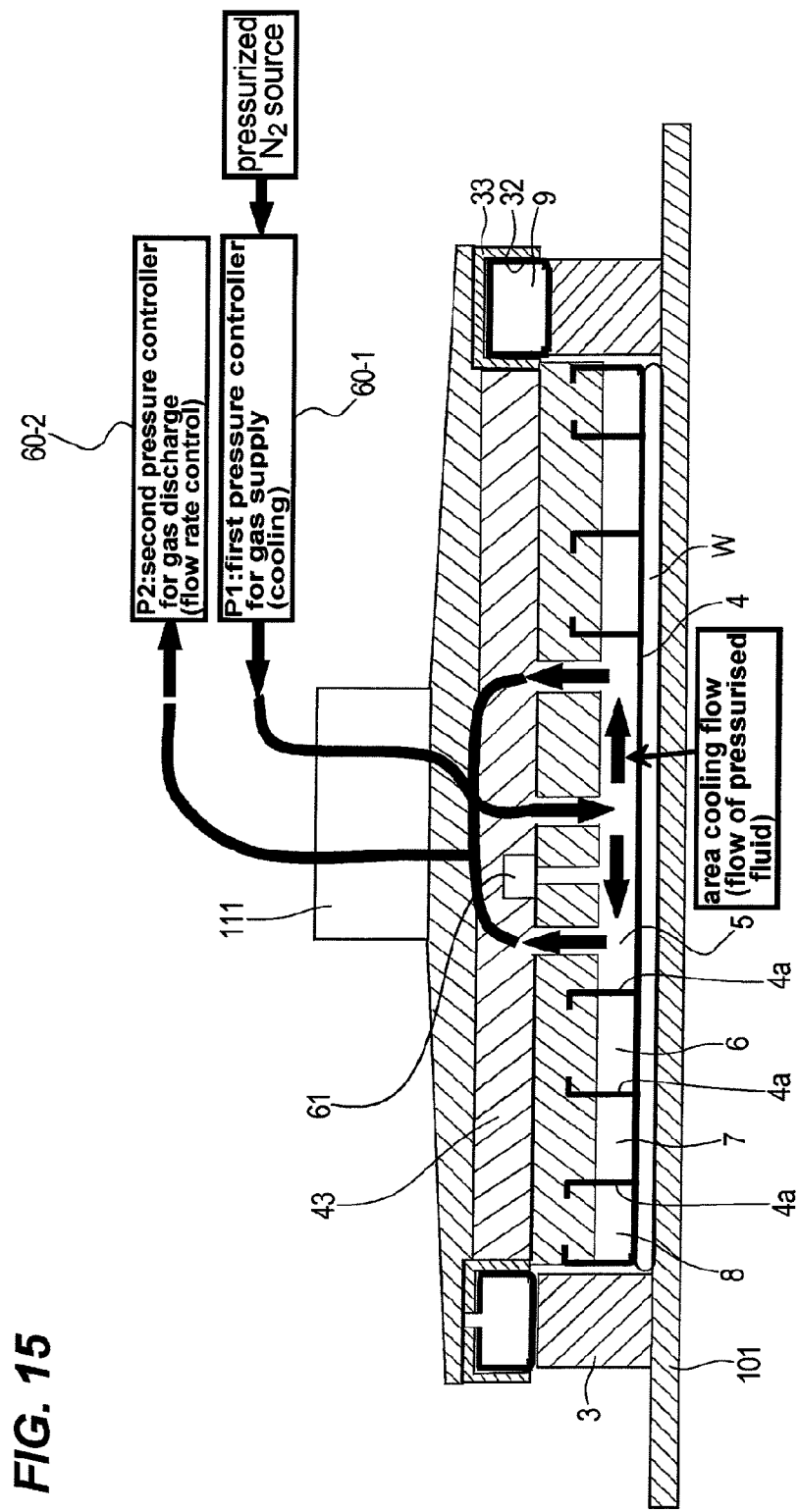
FIG. 15 is a schematic cross-sectional view of the top ring having structure for performing the temperature control of the pressure chamber.

Next, a method of controlling the temperature of the pressure chamber will be described. FIG. 15 is a schematic cross-sectional view of the top ring having structure for performing the temperature control of the pressure chamber. In FIG. 15, the infrared radiation thermometers and some elements illustrated in FIG. 3 are omitted. As shown in FIG. 15, a first pressure controller 60-1 and a second pressure controller 60-2 are coupled to one pressure chamber (e.g., the central chamber 5). A pressure sensor 61 for monitoring the pressure in the pressure chamber (the central chamber 5) is provided. The two pressure controllers 60-1 and 60-2 are set to the same control pressure at the start of polishing. When the estimate value of the wafer temperature exceeds a predetermined temperature during the polishing process, the set value of one of the pressure controllers 60-1 and 60-2 is lowered. For example, at the start of polishing, both of the pressure controller 60-1 and the pressure controller 60-2 pressurize a fluid at a set value of 200 hPa. During pressurizing, the wafer is pressed at 200 hPa. When the estimate value of the wafer temperature exceeds the predetermined temperature, the set pressure of the pressure controller 60-2 is lowered to 180 hPa, while the set pressure of the pressure controller 60-1 is maintained at 200 hPa. In this case, the pressurized fluid flows from a fluid passage communicating with the pressure controller 60-1 toward a fluid passage communicating with the pressure controller 60-2. This flow of the pressurized fluid cools the interior of the pressure chamber (the central chamber 5). Further, during cooling, the pressure in the pressure chamber is monitored by the pressure sensor 61. When the pressure in the pressure chamber drops far below 200 hPa, the set pressure of the pressure controller 60-2 is increased so that a desired pressure is developed in the pressure chamber.

In order to further improve a cooling effect in the pressure chamber, it is preferable to further lower the set pressure of the pressure controller 60-2 so as to increase a flow rate of the pressurized fluid flowing through the pressure chamber. The pressurized fluid may have a controlled temperature. For example, the pressurized fluid having a low temperature may be used to further improve the cooling effect. Alternatively, the pressurized fluid having a high temperature may be used. For example, when the estimate value of the wafer temperature is not more than the predetermined temperature, the high-temperature pressurized fluid may be passed through the pressure chamber so as to increase the temperature of the wafer. It is also possible to use a combination of the low-temperature pressurized fluid and the high-temperature pressurized fluid. For example, when the temperature of the wafer is low at the initial stage of polishing, the high-temperature pressurized fluid is passed through the pressure chamber so as to accelerate the increase in the temperature of the wafer, and when the temperature of the wafer becomes high during polishing, the pressurized fluid having a low temperature or an ordinary temperature is passed through the pressure chamber so as to suppress the increase in the temperature of the wafer. The membrane for pressing the wafer may be configured to define a plurality of pressure chambers, and the wafer temperature may be estimated and controlled in the respective pressure chambers. Alternatively, the wafer temperature may be estimated in one of the pressure chambers and the temperature control may be performed using this estimated temperature. Further, since the pressure sensor 61 has a temperature characteristic, the measured value of the pressure sensor 61 may be compensated using the temperature measurement result of the carrier 43.

The estimate value of the wafer temperature is further used for changing various polishing conditions. When the estimate value of the wafer temperature of a portion corresponding to one pressure chamber (e.g., the central chamber 5) is higher than the estimate value of the wafer temperature of a portion corresponding to another pressure chamber (e.g., the ripple chamber 6) during polishing, the pressure of the one pressure chamber (the central chamber 5) is lowered so as to suppress the increase in the temperature, or the pressure of another pressure chamber (the ripple chamber 6) is increased so as to accelerate the increase in the temperature of that pressure chamber (the ripple chamber 6). Further, a cooling and heating device for the polishing surface 101a (see FIG. 1), which is provided outside the substrate holding apparatus, may be used for controlling the temperature of the polishing surface 101a in its entirety or may be used for controlling a temperature of a portion of the polishing surface 101a corresponding to the pressure chamber whose temperature is measured. Examples of the temperature controlling device for the polishing surface include a device configured to bring a medium into contact with the polishing surface so as to control the temperature thereof and a device configured to blow a fluid onto the polishing surface. In order to control the polishing temperature, the pressing force of the retainer ring 3 (see FIG. 1) may be changed, or the dressing conditions, such as a dressing load and a scanning speed, may be changed in a portion of the polishing surface corresponding to the pressure chamber whose temperature is measured so as to accelerate or suppress the polishing process. The dressing conditions may be changed when performing In-situ dressing (which is a dressing operation performed during polishing) or Ex-situ dressing (which is a dressing operation performed after polishing). The flow rate of the polishing slurry may be changed for the temperature control, and a dropping position of the polishing slurry may be changed using the temperature measurement results. The combination of these temperature controlling devices may also be used. Further, the temperature of the polishing surface may be measured, and the above-described temperature control may be performed using the temperature measurement result of the polishing surface and the temperature measurement result of the wafer.

Next, specific examples of the aforementioned temperature controlling device for the polishing surface will be described with reference to FIGS. 16 through 21.

Figure 16:
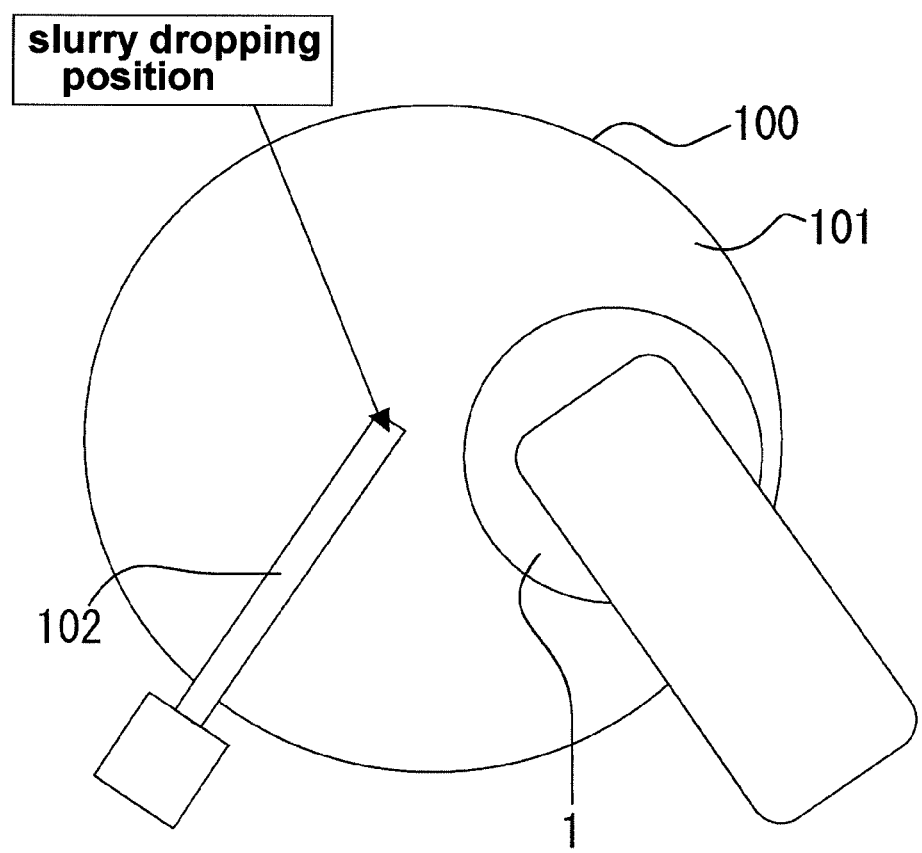
FIG. 16 is a schematic plan view showing an arrangement of the polishing liquid supply nozzle for supplying the polishing slurry (polishing liquid), the polishing pad, and the top ring.

FIG. 16 is a schematic plan view showing an arrangement of the polishing liquid supply nozzle for supplying the polishing slurry (polishing liquid), the polishing pad, and the top ring. As shown in FIG. 16, the polishing liquid supply nozzle 102 is provided above the polishing table 100, so that the polishing liquid supply nozzle 102 drops (or supplies) the polishing slurry onto a predetermined position of the polishing pad 101 on the polishing table 100. A tip of a nozzle portion of the polishing liquid supply nozzle 102 is adjacent to the top ring 1.

Figure 17:
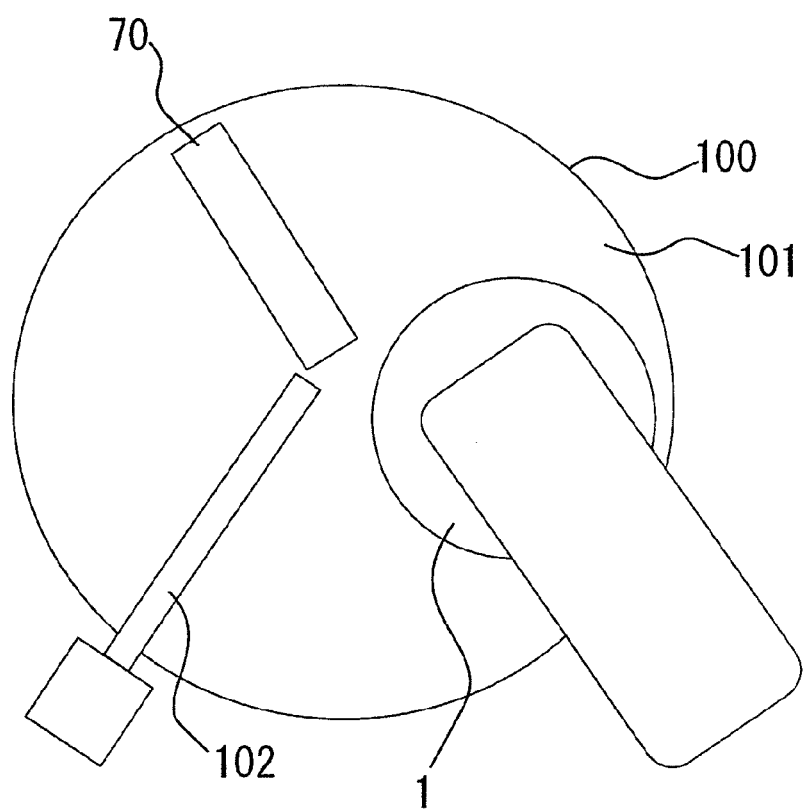
FIG. 17 is a schematic plan view showing an example of the temperature controlling device for the polishing pad.

FIG. 17 is a schematic plan view showing an example of the temperature controlling device for the polishing pad. In the example shown in FIG. 17, when the wafer has a high temperature, a polishing pad temperature controlling device 70, which has been cooled by a cooling medium, is brought into contact with the polishing pad 101 to thereby cool the polishing pad (i.e., the polishing surface).

Figure 18:
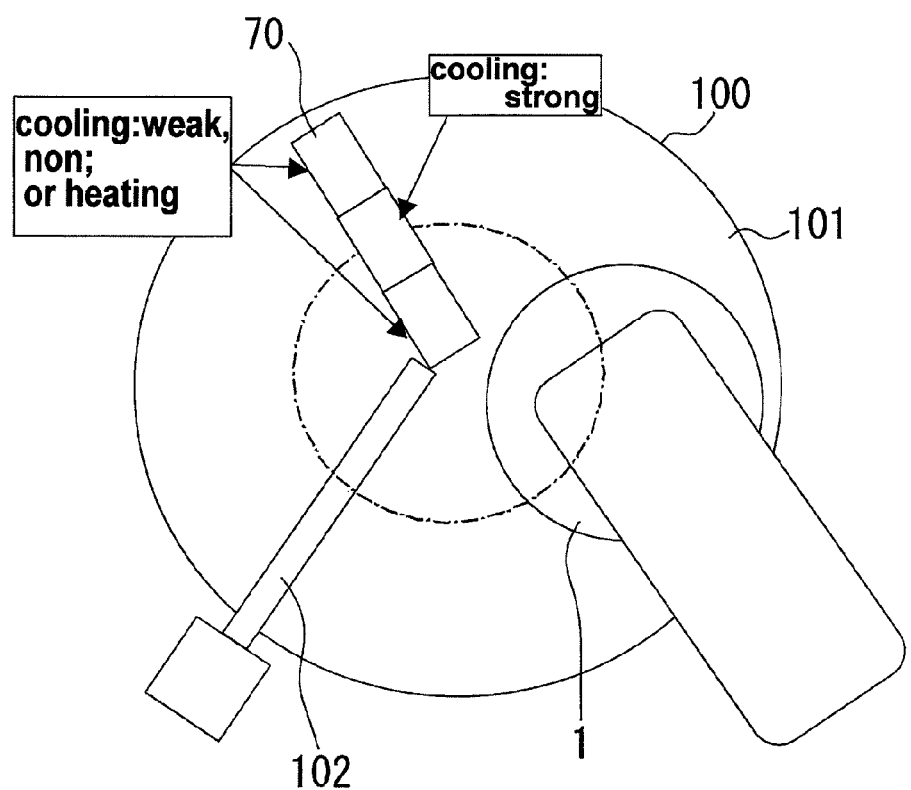
FIG. 18 is a schematic plan view showing another example of the temperature controlling device for the polishing pad.

FIG. 18 is a schematic plan view showing another example of the temperature controlling device for the polishing pad. In the example shown in FIG. 18, the polishing pad temperature controlling device 70 strongly cools a portion of the polishing pad 70 that lies in a position corresponding to a high-temperature portion of the wafer (e.g., the central portion of the wafer). Specifically, stronger cooling is performed by a central portion of the polishing pad temperature controlling device 70 for cooling the portion of the polishing pad corresponding to the central portion of the wafer. Simultaneously, weaker cooling is performed by both side portions of the polishing pad temperature controlling device 70 for cooling a portion of the polishing pad corresponding to other portion of the wafer, or that portion of the polishing pad is not cooled or is heated.

Figure 19:
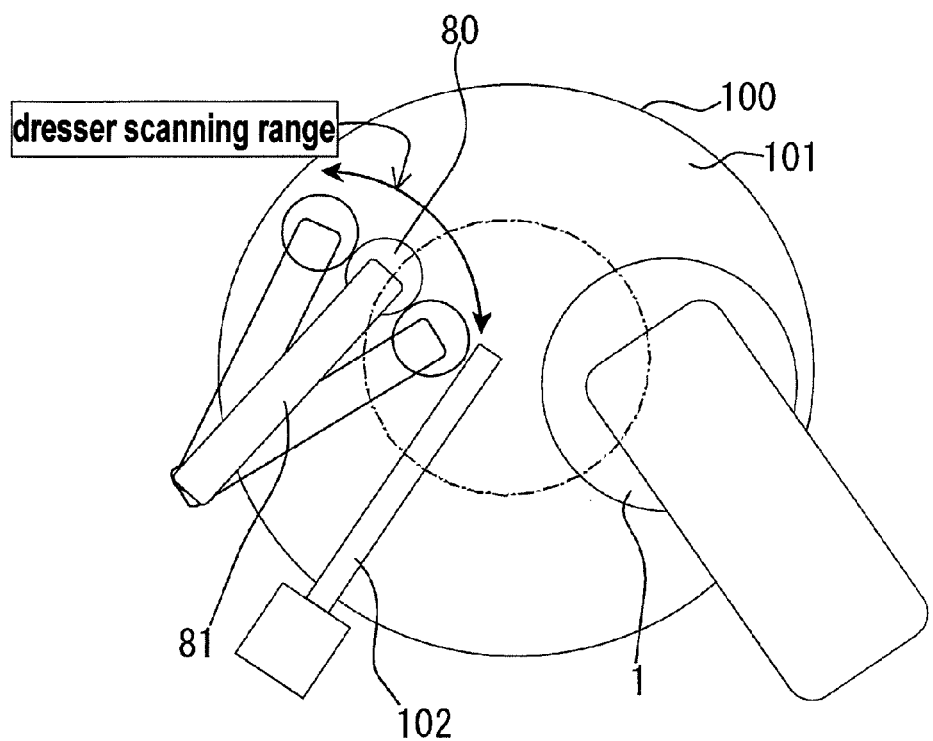
FIG. 19 is a schematic plan view showing an example in which the dressing load (dress load) and/or the scanning speed is changed.

FIG. 19 is a schematic plan view showing an example in which the dressing load (dress load) and/or the scanning speed is changed. As shown in FIG. 19, a disk-shaped dresser 80 for dressing the polishing pad 101 on the polishing table 100 is provided. During dressing, the dresser 80 is pressed against the polishing pad 101 at a predetermined dressing load. Further, the dresser 80 can be oscillated within a dresser scanning range by a horizontally-extending oscillation shaft 81. When the temperature of the central portion of the wafer is high (or low), the dressing load for dressing a portion of the polishing pad that lies in a position corresponding to the high-temperature portion (or low-temperature portion) of the wafer is reduced (or increased) to thereby adjust the polishing performance of the polishing pad. When the temperature of the central portion of the wafer is high (or low), the scanning speed for dressing a portion of the polishing pad that lies in a position corresponding to the high-temperature portion (or low-temperature portion) of the wafer is reduced (or increased) to thereby adjust the polishing performance of the polishing pad. The dressing conditions may be changed when performing the In-situ dressing which is a dressing process performed during polishing, or may be changed when performing the Ex-situ dressing which is a dressing process performed after polishing.

Figure 20:
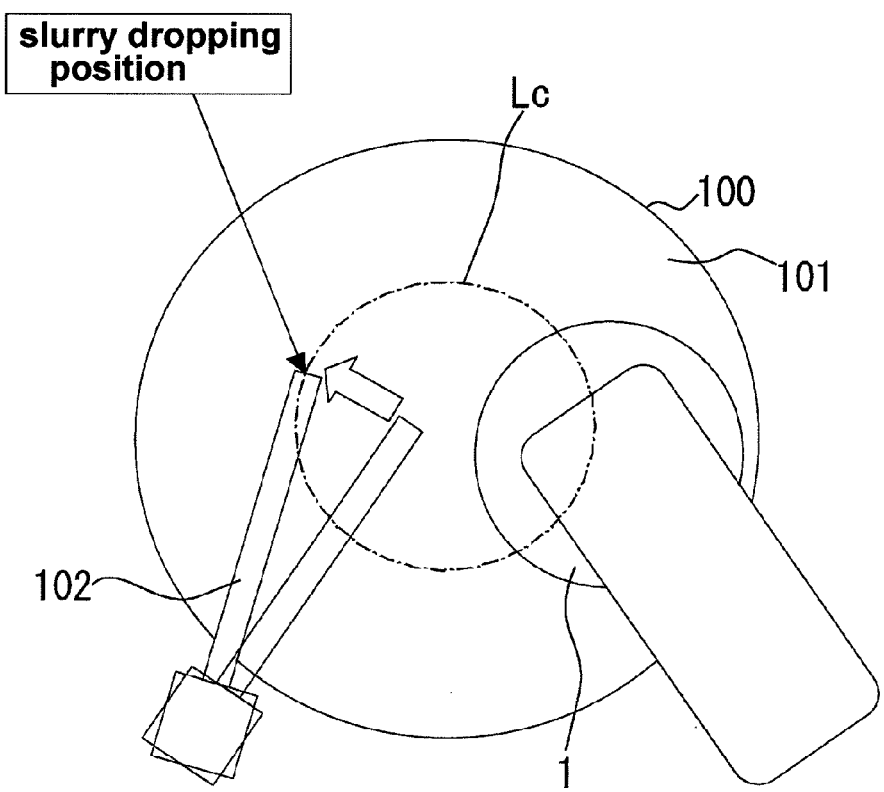
FIG. 20 is a schematic plan view showing an example of changing the dropping position of the polishing slurry in accordance with the temperature of the wafer.

FIG. 20 is a schematic plan view showing an example of changing the dropping position of the polishing slurry in accordance with the temperature of the wafer. As shown in FIG. 20, when the temperature of the central portion of the wafer is high, an angle of the polishing liquid supply nozzle 102 is changed, so that the dropping position of the polishing slurry lies on a trajectory (Lc) of the wafer center described on the polishing pad.

Figure 21:
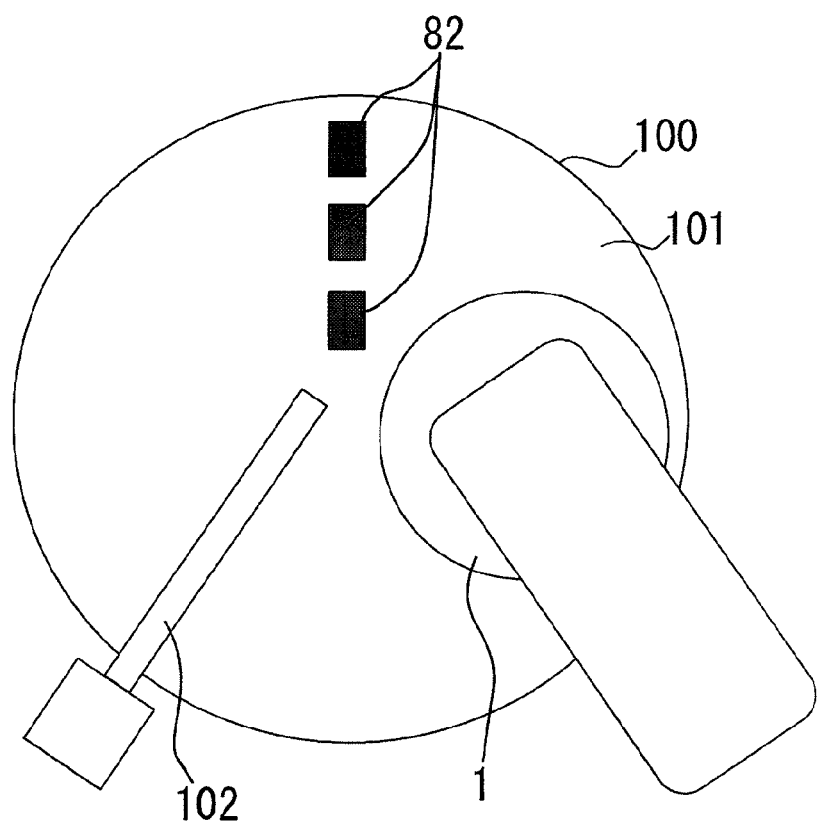
FIG. 21 is a schematic plan view showing an example in which the temperature (distribution) of the polishing pad surface is measured simultaneously with the wafer temperature measurement and the temperature control is performed based on the measurement results.

FIG. 21 is a schematic plan view showing an example in which the temperature (distribution) of the polishing pad surface is measured simultaneously with the wafer temperature measurement and the temperature control is performed based on the measurement results. In the example shown in FIG. 21, a plurality of infrared radiation thermometers 82 are provided above the polishing table 100. These infrared radiation thermometers 82 are located away from the polishing pad 101 on the polishing table 100. The temperature of the polishing surface of the polishing pad 101 is measured by the plurality of infrared radiation thermometers 82, whereby a temperature distribution of the polishing pad surface is measured. Then, the temperature control of the wafer is performed using the estimation result of the wafer temperature and the measurement result of the polishing surface temperature.

Other than the embodiments shown in FIG. 16 through FIG. 21, the polishing conditions may be changed using a combination of the estimate value of the wafer temperature (i.e., the estimate value of the substrate temperature) and information obtained by a sensor (e.g., an optical type or an eddy current type) that is embedded in the polishing table and is configured to measure a surface, being polished, of the wafer. For example, when time variation in the film thickness monitored by the eddy current sensor is slower in the central portion of the wafer than in other area during polishing and when the estimate value of the temperature is high in the central portion of the wafer, the temperature controlling device is controlled so as to lower the temperature of the central portion of the wafer. This is a case of process in which polishing is suppressed when the temperature rises above a certain value. It is possible to combine various types of control methods in accordance with processes. It is preferable that no opening (e.g., hole) exists in the wafer contact surface of the membrane that defines the pressure chamber in which the membrane temperature is measured. This is because a hole permits a cleaning liquid to enter the upper surface side of the membrane during a cleaning operation of the substrate holding apparatus and such a cleaning liquid could lower the accuracy of the membrane temperature measurement. In a case of providing an opening (e.g., a hole), it is preferable to eject a gas, such as $N_2$, from the carrier side onto the membrane temperature measuring zone during the cleaning operation of the substrate holding apparatus so as to remove water droplets.

In the case of using the substrate holding apparatus having the plurality of pressure chambers, the plurality of temperature sensors (e.g., the infrared radiation thermometers) for measuring the temperature of the membrane are provided so as to correspond to all of the pressure chambers and one measuring device is provided for measuring the carrier temperature, so that the wafer temperatures at positions corresponding to the respective pressure chambers can be estimated by the multiple linear regression equations provided for the respective membrane temperature sensors. Instead of providing the temperature sensors for all of the pressure chambers, at least two membrane temperature sensors may be provided. In this case, the measurement results of the at least two sensors may be used to interpolate and estimate the wafer temperature at a position corresponding to the pressure chamber with no membrane temperature sensor provided. The wafer temperature may be estimated from the measurement results of the two membrane temperature sensors using linear interpolation or other interpolation such as quadratic. According to this approach, the temperature distribution over the wafer surface can be estimated using less membrane temperature sensors. Further, the polishing conditions may be changed using the estimate temperature of the pressure chamber where no membrane temperature sensor is provided. For example, when the estimate temperature of the pressure chamber is high, the pressure in that pressure chamber is lowered.

Figure 22:
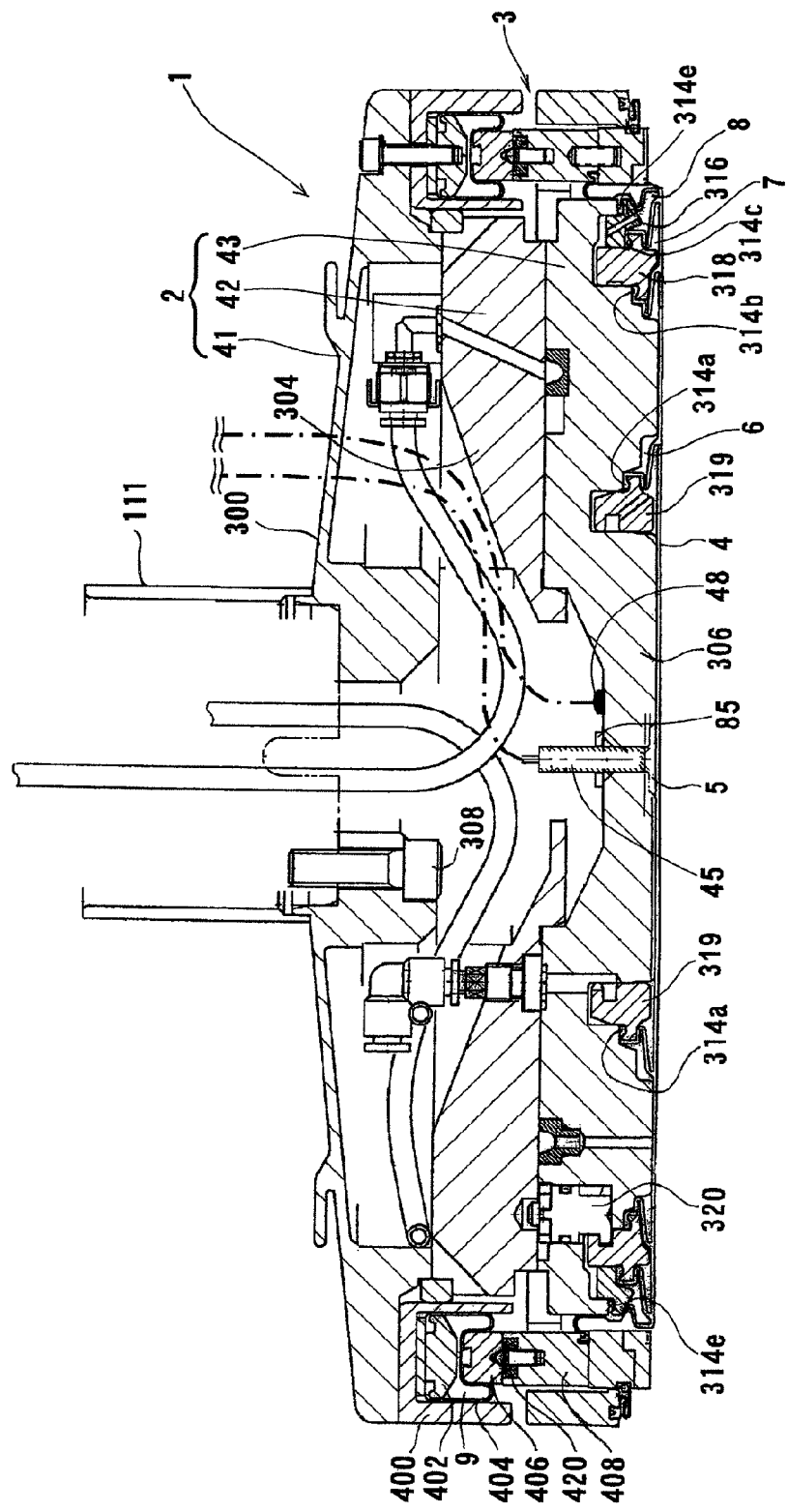
FIG. 22 is a cross-sectional view showing more detailed structures of the top ring having the infrared radiation thermometer and the thermocouple for measuring the carrier temperature.

FIG. 22 is a cross-sectional view showing more detailed structures of the top ring having the infrared radiation thermometer and the thermocouple for measuring the carrier temperature.

The top ring 1 shown in FIG. 22 corresponds to the top ring 1 shown in FIG. 3 with more detailed structures. As shown in FIG. 22, the top ring 1 is basically constituted by the top ring body 2 configured to press the semiconductor wafer against the polishing surface 101a (see FIG. 1) and the retainer ring 3 configured to press the polishing surface 101a directly. The top ring body 2 includes the disk-shaped top ring flange 41, the top ring spacer 42 attached to a lower surface of the top ring flange 41, and the carrier 43 attached to a lower surface of the top ring spacer 42. The retainer ring 3 is attached to the peripheral portion of the top ring flange 41 of the top ring body 2. The top ring flange 41 is coupled to the top ring shaft 111 by bolts 308. The top ring spacer 42 is secured to the top ring flange 41 by bolts (not shown), and the carrier 43 is secured to the top ring spacer 42 by bolts (not shown). The top ring flange 41, the top ring spacer 42, and the carrier 43 constitute the top ring body 2, which is made of resin, such as engineering plastic (e.g., PEEK). The top ring flange 41 may be made of metal, such as SUS or aluminum.

The elastic membrane 4 that is brought into contact with the rear surface of the semiconductor wafer is attached to the lower surface of the carrier 43. More specifically, the membrane 4 is attached to the lower surface of the carrier 43 by an annular edge holder 316 disposed at the peripheral portion of the membrane 4 and annular ripple holders 318 and 319 disposed inwardly of the edge holder 316. The membrane 4 is made of rubber material having excellent strength and durability, such as ethylene propylene rubber (EPDM), polyurethane rubber, and silicone rubber.

The edge holder 316 is held by the ripple holder 318, which is attached to the lower surface of the carrier 43 by a plurality of stoppers 320. Similarly, the ripple holder 319 is attached to the lower surface of the carrier 43 by a plurality of stoppers (not shown). The central chamber 5 is formed on the central portion of the membrane 4.

The ripple holder 318 is arranged so as to press a ripple 314b of the membrane 4 against the lower surface of the carrier 43, and the ripple holder 319 is arranged so as to press a ripple 314a of the membrane 4 against the lower surface of the carrier 43. An edge 314c of the membrane 4 is pressed against the edge holder 316 by the ripple holder 318.

The central chamber 5 is formed on the central portion of the membrane 4. Further, the annular ripple chamber 6 is formed between the ripple 314a and the ripple 314b of the membrane 4. The annular outer chamber 7 is formed by the outer partition wall 314b and the edge partition wall 314c of the membrane 4. The annular edge chamber 8 is formed by the edge partition wall 314c and a side wall 314e of the membrane 4. The pressure chambers 5, 6, 7, and 8 are connected to the pressure regulating unit 30 (see FIG. 2) via fluid passages formed in the top ring body 2.

The retainer ring 3 is configured to hold a peripheral edge of the semiconductor wafer. This retainer ring 3 includes a cylinder 400 having a closed top portion, a holding member 402 secured to the top portion of the cylinder 400, a membrane 404 held in the cylinder 400 by the holding member 402, a piston 406 connected to a lower end portion of the membrane 404, and a ring member 408 which is pushed down by the piston 406. The retainer ring pressure chamber 9 is formed in the membrane 404. This membrane 404 is made of rubber material having excellent strength and durability, such as ethylene propylene rubber (EPDM), polyurethane rubber, and silicone rubber.

The holding member 402 is provided with a fluid passage (not shown) communicating with the retainer ring pressure chamber 9 defined by the membrane 404. This fluid passage formed in the holding member 402 is connected to the pressure regulating unit 30 (see FIG. 2) via a fluid passage formed in the top ring body 2.

In the top ring 1 according to this embodiment, the pressures of the fluid supplied to the pressure chambers formed between the membrane 4 and the carrier 43 (i.e., the central chamber 5, the ripple chamber 6, the outer chamber 7, and the edge chamber 8) and the pressure of the fluid supplied to the retainer ring pressure chamber 9 can be adjusted independently. According to such structures, the pressing force of the membrane 4 that presses the semiconductor wafer against the polishing pad 101 can be adjusted in each area of the semiconductor wafer, and the pressing force of the retainer ring 3 that presses the polishing pad 101 can be adjusted as desired.

In the embodiment shown in FIG. 22, the infrared radiation thermometer 45 faces the central chamber 5 of the membrane 4. This infrared radiation thermometer 45 may be arranged so as to face another pressure chamber. In such a case, a position of the partition wall of the pressure chamber with respect to a radial direction of the wafer may be modified appropriately. In order to minimize an influence of noise, the infrared radiation thermometer 45 is located near the membrane 4 and arranged so as to face the membrane 4 (i.e., located at the carrier side). An O-ring 85 is provided between an outer surface of the infrared radiation thermometer 45 and the carrier 43, so that the pressurized fluid and vacuum pressure in the pressure chamber do not leak. The thermocouple 48 for measuring the temperature of the carrier 43 is provided on the upper surface of the carrier 43 and arranged in a position corresponding to the central chamber 5. A plurality of thermocouples 48 for measuring the temperature of the carrier 43 may be provided on the upper surface of the carrier 43 so as to correspond to the respective pressure chambers. A measured value obtained from one of the thermocouples 48 may be used as a temperature representing the temperature of the carrier 43. The temperature of the lower surface of the carrier 43 may be measured directly. In the case of measuring the temperature of the lower surface of the carrier 43 by the thermocouple on the upper surface of the carrier 43, it is preferable to make the carrier 43 as thin as possible in order to enable the thermocouple to measure the temperature of the lower surface of the carrier 43 with a good responsiveness. Further, since the carrier 43 is a removable component that is removed when replacing consumables of the top ring, it is preferable to use thermocouple connectors for connecting wires from the infrared radiation thermometer and the thermocouple in order to provide an easily removable structure.

In the top ring 1 constructed as shown in FIG. 22, the infrared radiation thermometer 45 measures a quantity of the infrared light radiated from the membrane 4, the thermocouple 48 measures the temperature of the carrier 43, and the wafer temperature is estimated from the measured value of the infrared radiation thermometer 45 and the measured value of the thermocouple 48, as discussed previously with reference to FIGS. 3 through 13.

Although the embodiments of the present invention have been described herein, the present invention is not intended to be limited to these embodiments. Therefore, it should be noted that the present invention may be applied to other various embodiments within a scope of the technical concept of the present invention.

What is claimed is:

1. A substrate holding apparatus for holding a substrate and pressing the substrate against a polishing surface, comprising:
   an elastic membrane configured to form a substrate holding surface which is brought into contact with the substrate;
   a carrier provided above said elastic membrane;
   at least one pressure chamber formed between said elastic membrane and said carrier;
   an infrared light detector configured to measure thermal energy from said elastic membrane; and
   a measuring instrument disposed at a rear surface side of said substrate holding surface of said elastic membrane and configured to measure thermal energy of a portion other than said elastic membrane.

2. A substrate holding apparatus according to claim 1, wherein said measuring instrument measures the thermal energy of said carrier.

3. A substrate holding apparatus according to claim 1, further comprising a pressure sensor configured to measure a pressure of said pressure chamber.

4. A substrate holding apparatus according to claim 1, further comprising a controller configured to calculate an estimate value of a temperature of said elastic membrane using a measured value of said infrared light detector and a measured value of said measuring instrument.

5. A substrate holding apparatus according to claim 4, wherein plural sets of a measured value of a temperature of said elastic membrane, a measured value ($T_1$) of said infrared light detector, and a measured value ($T_2$) of said measuring instrument are prepared in advance;
   regression coefficients $b_0$, $b_1$, and $b_2$ which minimize (the measured value of the temperature of said elastic membrane−the estimate value of the temperature of said elastic membrane)$^2$ in a multiple linear regression equation represented by (the estimate value of the temperature of said elastic membrane)=$b_0+b_1\times T_1+b_2\times T_2$ are calculated; and
   the estimate value of the temperature of said elastic membrane is calculated by the following equation: (the estimate value of the temperature of said elastic membrane)=$b_0+b_1\times$(the measured value of the temperature of said elastic membrane)+$b_2\times$(the measured value of said measuring instrument).

6. A substrate holding apparatus according to claim 4, wherein said controller calculates an estimate value of a temperature of the substrate using the estimate value of the temperature of said elastic membrane and the measured value of said measuring instrument.

7. A substrate holding apparatus according to claim 6, wherein plural sets of a measured value of a temperature of the substrate, the estimate value ($T_1$) of the temperature of said elastic membrane and the measured value ($T_2$) of said measuring instrument are prepared in advance;
   regression coefficients $b_0$, $b_1$ and $b_2$ which minimize (the measured value of the temperature of the substrate—the estimate value of the temperature of the substrate)$^2$ in a multiple linear regression equation represented by (the estimate value of the temperature of the substrate)=$b_0+b_1\times T_1+b_2\times T_2$ are calculated; and
   the estimate value of the temperature of the substrate is calculated by the following equation: (the estimate value of the temperature of the substrate)=$b_0+b_1\times$(the estimate value of the temperature of said elastic membrane)+$b_2\times$(the measured value of said measuring instrument).

8. A substrate holding apparatus according to claim 1, wherein at least two pressure chambers are formed between said elastic membrane and said carrier, and said infrared light detector is provided in at least one pressure chamber of said at least two pressure chambers.

9. A substrate holding apparatus according to claim 1, wherein said substrate holding surface has no opening.

10. A substrate holding apparatus according to claim 1, wherein said infrared light detector comprises an infrared radiation thermometer.

11. A polishing apparatus comprising;
   a polishing table having a polishing surface; and
   a substrate holding apparatus for holding a substrate and pressing the substrate against a polishing surface, comprising:
   an elastic membrane configured to form a substrate holding surface which is brought into contact with the substrate;
   a carrier provided above said elastic membrane;
   at least one pressure chamber formed between said elastic membrane and said carrier;
   an infrared light detector configured to measure thermal energy from said elastic membrane; and
   a measuring instrument disposed at a rear surface side of said substrate holding surface of said elastic membrane and configured to measure thermal energy of a portion other than said elastic membrane.

* * * * *